United States Patent
Tomishima

(10) Patent No.: US 6,953,960 B2
(45) Date of Patent: Oct. 11, 2005

(54) SEMICONDUCTOR MEMORY DEVICE

(75) Inventor: Shigeki Tomishima, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 518 days.

(21) Appl. No.: 09/996,574

(22) Filed: Nov. 30, 2001

(65) Prior Publication Data

US 2002/0153545 A1 Oct. 24, 2002

(30) Foreign Application Priority Data

Apr. 23, 2001 (JP) .................................. 2001-124350

(51) Int. Cl.$^7$ .................. H01L 27/108; H01L 29/76; H01L 29/94; H01L 31/119; H01L 29/788
(52) U.S. Cl. .................. 257/300; 257/296; 257/311; 257/314; 257/321; 365/63
(58) Field of Search ................ 257/296, 300, 257/311, 314, 321, 96; 365/63

(56) References Cited

U.S. PATENT DOCUMENTS 5,748,549 A * 5/1998 Kometani et al. .......... 365/226
5,903,492 A * 5/1999 Takashima .................. 365/145
5,963,467 A * 10/1999 Miyatake et al. ........... 365/149
6,240,006 B1 * 5/2001 Kawasaki .................... 365/63

FOREIGN PATENT DOCUMENTS

| JP | 3-265167 | 11/1991 |
| JP | 8-340089 | 12/1996 |
| JP | 11354745 | * 12/1999 |

* cited by examiner

Primary Examiner—Nathan J. Flynn
Assistant Examiner—Victor A. Mandala, Jr.
(74) Attorney, Agent, or Firm—McDermott, Will & Emery

(57) ABSTRACT

A first level metal interconnection line in a layer below a third level metal interconnection line serving as a main word line MWL is used as a shunting interconnection line and electrically connected to a first level polysilicon interconnection line constituting a sub word line SWL at prescribed intervals. By applying a hierarchical word line structure and a word line shunting structure both, a word line is driven into a selected state at high speed without increasing an array occupancy area and manufacturing steps.

12 Claims, 12 Drawing Sheets

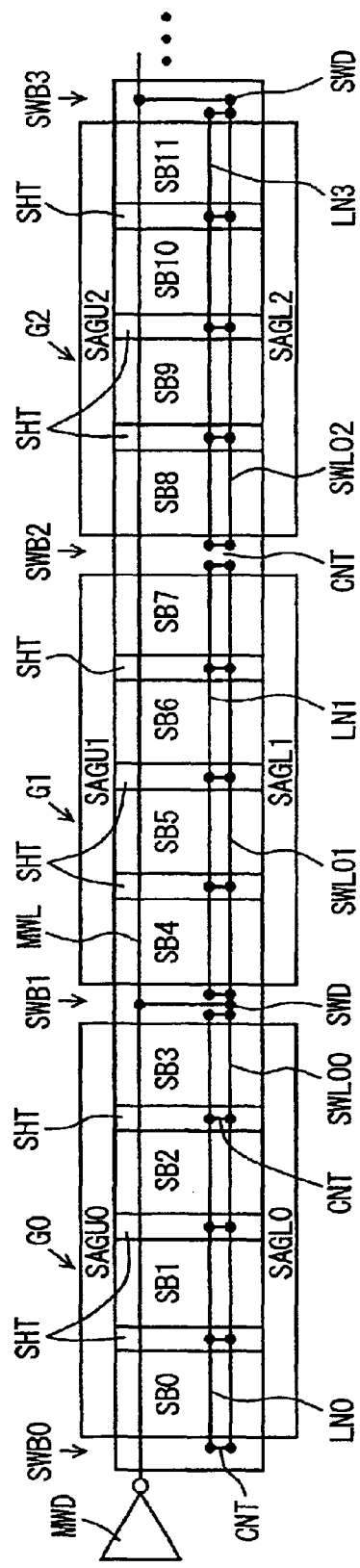
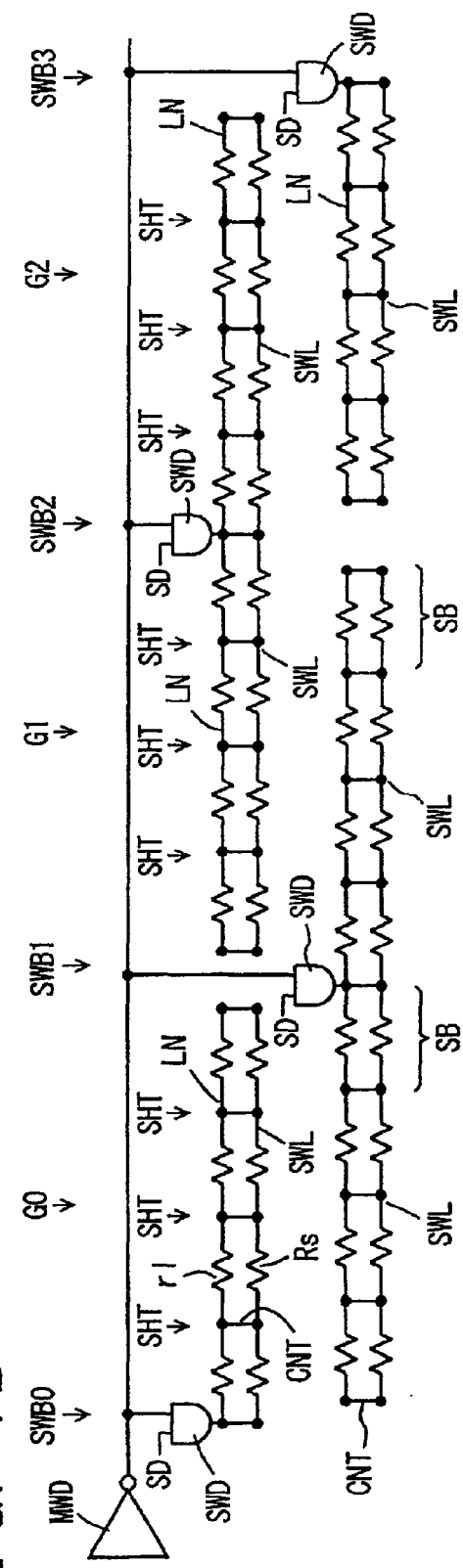
F I G. 4A
F I G. 4B

FIG. 11
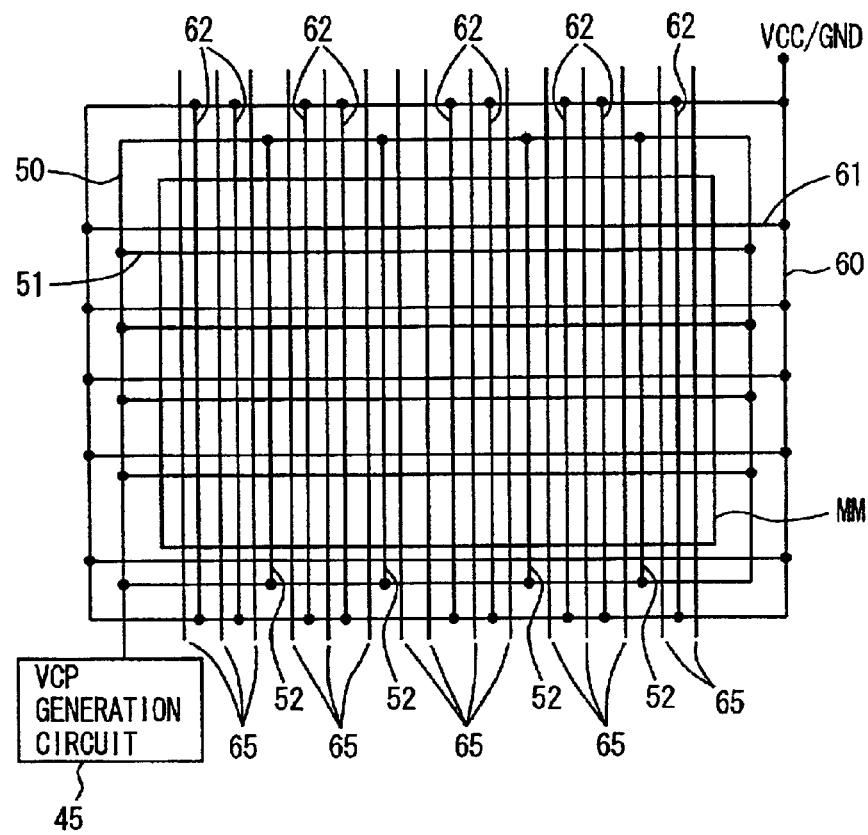
FIG. 12
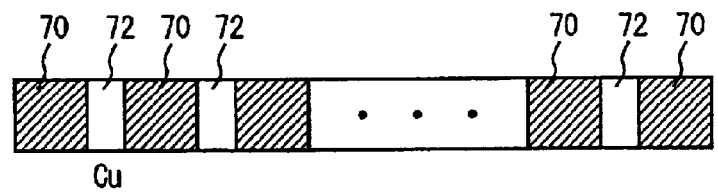
FIG. 13
4Cu: | VCC/GND |—83
3Cu: | MWL |—82
2Cu: | IO |—81 : VCP
1Cu: | LN |—80

SEMICONDUCTOR MEMORY DEVICE

BACKGROUND OF THE INVENTION

1. Field of the Invention

The present invention relates to a semiconductor memory device, and particularly, to a semiconductor memory device of a multilayer metal interconnection line structure. More particularly, the present invention relates to a configuration for a word line of an embedded memory integrated with a logic circuit on the same semiconductor substrate.

2. Description of the Background Art

FIG. 17A is a diagram schematically showing an arrangement of array mats (memory mats) of a conventional DRAM (dynamic random access memory). In FIG. 17A, the DRAM includes four memory mats MM0 to MM3 placed in respective regions of four quartered regions on a semiconductor chip CH. Memory mats MM0 to MM3 each have a storage capacity of 16 M bits, for example, with a total storage capacity of 64 M bits.

A peripheral circuit PH0 is placed in a region between memory mats MM0 and MM2 and memory mats MM1 and MM3, a peripheral circuit PH1 is placed in a region between memory mats MM0 and MM2, and a peripheral circuit PH2 is placed in a region between memory mats MM1 and MM3. Peripheral circuit PH0 includes a peripheral control circuit that controls operations of memory mats MM0 to MM3, for example. Peripheral circuits PH1 and PH2 each include a data input/output circuit and an address input circuit, for example. Peripheral circuits PH1 and PH2 may further include local control circuits controlling operations of corresponding memory mats MM0 to MM3 according to a control signal from a main control circuit included in peripheral circuit PH0.

By placing memory mats MM0 to MM3 in four quartered regions on semiconductor chip CH separately, lengths of word lines and bit lines included in each of memory mats MM0 to MM3 are reduced to decrease a time required for selection of a memory cell and data transfer.

FIG. 17B is a diagram schematically showing an example of a configuration of memory mats MM0 to MM3 shown in FIG. 17A. Since each of memory mats MM0 to MM3 has the same configuration with others, an arrangement in one memory mat MM is shown in FIG. 17B. In FIG. 17B, memory mat MM is divided into 16 sub blocks SUB by word line shunt regions SHT in a row direction, while being divided into 32 sub blocks SUB by sense amplifier bands SAB in a column direction.

In a sub block UB, 256 word lines and 128 bit lines are placed, and therefore sub blocks UB has a storage capacity of 32 K bits.

A word line shunt region SHT is a region in which electrical connection is made between a highly resistive word line connected to gates of memory cell transistors and a low resistivity metal interconnection line ion line formed of aluminum or the like above the word line. By interconnecting the metal interconnection line ion line and the word line electrically, a resistance of the word line is reduced equivalently to transmit a word line drive signal to an end thereof at high speed.

In a sense amplifier band SAB, sense amplifier circuits are provided corresponding to respective bit line pairs. A sense amplifier circuit is shared between bit line pairs of sub blocks adjacent to each other in the column direction.

A column decoder CD is provided to memory mat MM. Activation of a sub block is performed with sub blocks SUB aligned in the row direction being a unit. A column select signal from column decoder CD is applied commonly to sub blocks SUB aligned in the column direction. Only a local internal data line provided to a sub block in a selected state is coupled to a global internal data line (IO line) according to a row block select signal, for example.

As shown in FIG. 17B, by dividing memory mat MM into sub blocks in the column direction, a length of a bit line pair is reduced to decrease a bit line load and implement a high speed sense operation. Furthermore, by providing a word line shunt region SHT, a word line is driven into a selected state at high speed as described below.

FIG. 18 is a diagram schematically showing arrangement of a word line for sub blocks SUB aligned in the row direction. A common word line WL is provided for sub blocks aligned in the row direction. Word line WL is driven by a word line driver. A word line shunt region SHT is arranged between adjacent sub blocks SUB.

FIG. 19 is a diagram schematically showing a configuration related to the word line shown in FIG. 18. In FIG. 19, a low resistivity metal interconnection line UPL is provided above and in parallel to word line WL. Metal interconnection line UPL and word line WL are both connected to a word driver WD. Metal interconnection line UPL and word line WL are electrically connected (short circuited) to each other through a contact CNT in shunt region SHT. In one sub block, a metal interconnection line UPL has a resistance r, while word line WL has a resistance R. A word line WL is generally made of polysilicon, and has a large resistance, similar to the gate of a memory cell transistor. In the case where a high resistance word line WL is driven by a word driver WD provided at one end of a memory mat, a long propagation delay arises in transmission of a word line drive signal to sub block UB farthest from word driver WD. Such a signal propagation delay disables high speed driving of a word line into a selected state.

In order to reduce propagation delay of a word line drive signal, a metal interconnection line UPL is provided in parallel to a word line WL in an upper layer thereof and electrically connected to word line WL through contacts CNT in shunt regions SHT. Such a structure in which a word line WL is electrically connected (short circuited) to a low resistivity metal interconnection line at a prescribed interval between adjacent connection points is called a word line shunting (strapping) structure. The metal interconnection line UPL has a low resistance value and therefore, causes a short signal propagation delay. By utilizing such a structure, a word line drive signal from a word driver WD is transmitted to the sub block at the farthest position at high speed to drive a word line into a selected state at high speed.

FIG. 20 is a diagram schematically showing another arrangement of array mats. In FIG. 20, a DRAM includes memory block regions MB0 to MB3 arranged in respective 4 quartered regions. A peripheral circuit PHA is placed between memory blocks MB0 and MB1 and memory blocks MB2 and MB3. A row decoder RD is placed between memory blocks MB0 and MB1 and another row decoder RD is placed between memory blocks MB2 and MB3.

Each of memory blocks MB0 to MB3 includes 4 memory sub arrays (memory mats) MRY0 to MRY3. Column decoders CD are provided corresponding to the respective memory sub arrays MRY0 to MRY3. An internal data line is placed between memory sub arrays MRY0 and MRY1, and an internal data line is placed between memory sub arrays MRY2 and MRY3.

The DRAM shown in FIG. 20 has a storage capacity of 512 M bits and each of memory block regions MB0 to MB3 has memory cells of 128 bits arranged therein. That is, each of memory sub arrays MRY0 to MRY3 has a storage capacity of 32 M bits.

In the DRAM shown in FIG. 20, each of memory sub arrays MRY0 to MRY3 is fabricated suppressing increase in an occupancy area thereof, with a design rule for a memory cell made small to miniaturize a memory transistor. However, a storage capacity of a memory mats (memory sub arrays) becomes as large as 32 M bit and a row select signal is transmitted from a row decoder disposed at one end of a memory block MB commonly to corresponding memory sub arrays MRY0 to MRY3, and therefore, a length of a word line becomes long, and it becomes impossible to meet a requirement of high speed operation even with the above word line shunt structure.

Furthermore, a similar arrangement of memory mats are also used in a DRAM having a storage capacity of 256 M bits and a storage capacity of each memory mats (memory sub arrays) is 16 M bits. In this case, with a storage capacity of one memory sub array MRY (MRY0 to MRY3) being 16 M bits, if a row decoder is provided between memory arrays, a configuration of memory mats becomes similar to the configuration shown in FIG. 17. Therefore, by use of the word line shunt structure, a propagation delay time of a word line drive signal can be reduced. However, in a 256 M bit DRAM, an even higher speed has been required as an operating condition, and therefore, a signal propagation delay time through a metal interconnection line UPL (see FIG. 19) in an upper layer cannot be neglected only with reduction in propagation delay of a word line drive signal using a word line shunt structure. Consequently, there is caused a situation in which the demand for high speed operation cannot be satisfied.

Instead of the word line shunt structure, a hierarchical word line drive scheme is utilized in order to drive a word line at even higher speed.

FIG. 21 is a diagram schematically showing a configuration related to a word line according to the hierarchical word drive scheme. In FIG. 21, one memory sub array is divided into plural memory sub blocks MSBK by sub word driver bands SWB. A main word line MWL is provided commonly to memory sub blocks MSBK aligned in the row direction. Sub word lines SWL are provided in each of memory sub blocks MSBK. Sub word lines SWL are provided corresponding to respective memory cell rows of a corresponding memory sub block MSBK and connected to memory cells on corresponding rows. A sub word line SWL is made of polysilicon, similar to a gate material of a memory cell transistor, and has a high resistivity.

In a sub word driver band SWB, sub word drivers SWD are provided corresponding to sub word lines. Sub word drivers SWD are provided to rows alternately in sub word driver bands on both sides of each memory sub block in order to alleviate a pitch condition on placement of the sub word drivers. A sub word driver SWD drives sub word lines SWL on adjacent two memory sub blocks MSBK to a selected state according to a signal on a corresponding main word line MWL and a sub decode signal.

A main word line is provided corresponding to a prescribed number of sub word lines and formed of a low resistivity metal interconnection line. Main word drivers MWD are provided corresponding to the respective main word lines, and a main word line drive signal from main word line driver MWD is transmitted onto a corresponding main word line MWL. That is, word lines are constructed in a hierarchical structure including main word lines driven by main word line drivers and sub word lines driven by sub word line drivers. Since memory cells are not connected to a main word line, a load resistance and a load capacitance of a main word line are small, thereby driving a main word line into a selected state at high speed. Furthermore, a sub word line SWL is provided only within a corresponding memory sub block and therefore, has a small number of memory cells connected thereto, to have a small load to be driven, thereby enabling a sub word line to be driven into a selected state at even higher speed.

FIG. 22 is a diagram specifically showing a configuration of a sub word driver band.

In FIG. 22, a sub word driver SWD is provided commonly to sub word lines in adjacent memory sub arrays on both sides of a sub word driver band SWB and drives a corresponding sub word line SWL into a selected state according to a signal on a corresponding main word line MWL and a sub decode signal, not shown. In FIG. 22, since sub word drivers SWD are provided to one in alternate rows in one sub word driver band SWB, sub word drivers SWDa and SWDc placed in respective sub word driver bands SWBa and SWBc each drive sub word lines in two memory sub blocks. In sub word driver band SWBb, no sub word driver is placed in alignment with sub word drivers SWDa and SWDc. In order to drive sub word lines provided on each of other rows, sub word drivers are placed in sub word driver band SWBb.

As shown in FIG. 22, word lines are organized in a hierarchical structure composed of main word lines MWL and sub word lines SWL, and main word lines MWL are formed of metal interconnection line with a small resistance, rm. Therefore, a main word line drive signal can be transmitted to an end of a selected main word line at high speed by main word driver MWD. Even if a resistance Rs of sub word line SWL is larger, compared with that of main word line MWL, a resistance of each sub word line is small since sub word lines are provided in units of memory sub blocks MSBK, thereby enabling a sub word line SWL to be driven into a selected state at high speed by sub word drivers (SWDa and SWDc). Particularly, main word driver MWD is only required to drive main word line MWL, thereby enabling a main word line drive signal to be transmitted up to the end of main word line MWL at high speed.

Hence, according to the hierarchical word drive scheme, since sub word drivers are placed in a distributed manner in a memory mat, a drive capability thereof for sub word line SWL can be increased, thereby enabling sub word line SWL to be driven into a selected state at high speed.

FIG. 23 is a diagram showing an example of a configuration of sub word driver SWD (SWDa and SWDc) shown in FIGS. 21 and 22. In FIG. 23, sub word driver SWD includes: a P channel MOS transistor (insulated gate field effect transistor) Q1 for transmitting sub decode signal SD onto sub word line SWL according to a main word line drive signal ZMWL on main word line MWL; an N channel MOS transistor Q2 coupling sub word line SWL to a ground node according to main word line drive signal ZMWL; and an N channel MOS transistor Q3 coupling sub word line SWL to the ground node according to a complementary sub decode signal ZSD. Main word line drive signal ZMWL is at L level when selected, and at H level when non-selected.

The reason why sub decode signals SD and ZSD are used in sub word driver SWD is as follows: One main word line MWL is provided for a prescribed number of, for example 4 or 8, sub word lines SWL. With such an arrangement, a pitch condition for main word lines is alleviated. One of the prescribed number of sub word lines SWL in one memory sub block MSBK is selected according to sub decode signals SD and ZSD. Sub decode signals SD and ZSD are complementary to each other.

When main word drive signal ZMWL is at H level, MOS transistor Q1 is in a non-conductive state, while MOS transistor Q2 is in a conductive state to couple sub word line SWL to the ground potential. In this case, sub word line SWL is kept in a non-selected state, independently of logic levels of sub decode signals SD and ZSD.

When main word line drive signal ZMWL is at L level and sub decode signal SD is at H level, MOS transistor Q1 becomes conductive to transmit sub decode signal SD at H level onto sub word line SWL and drive sub word line SWL into a selected state. At this time, complementary sub decode signal ZSD is at L level and MOS transistor Q3 is in a non-conductive state.

When main word line drive signal ZMWL goes to L level, MOS transistor Q2 enters a non-conductive state. When sub decode signal SD is at L level, MOS transistor Q1 has the gate and source thereof at the same voltage level to enter a non-conductive state. At this time, complementary sub decode signal ZSD is at H level to cause MOS transistor Q3 to be conductive and keep sub word line SWL at the ground voltage level. That is, when main word line drive signal ZMWL is at L level and sub decode signal SD is at L Level, MOS transistors Q1 and Q2 both enter a non-conductive state and therefore, MOS transistor Q3 is caused to be in a conductive state using complementary sub decode signal ZSD in order to prevent the sub word line from entering a floating state, to raise the non-selected sub word lines at a potential level above ground potential level reliably.

Since sub word line driver SWD has plural MOS transistors, an occupancy area of a sub word driver is larger, compared with a structure such as a word line shunt structure in which a metal interconnection line is connected to word line WL with a contact. For this reason, the number of sub word driver bands SWB is restricted to be lower than the number of word line shunt regions and the number of memory sub blocks MSBK is less than the number of memory sub blocks UB in the word line shunt structure.

In the hierarchical word line drive scheme using sub word drivers SWD, although a layout area of sub word driver bands SWD becomes larger, a drive capability for sub word lines increases, and therefore, the number of memory sub arrays obtained by division of a memory array is reduced, thereby balancing a trade-off between increase in operating speed and suppression of increase in layout area.

In order to reduce total power consumption of a system, realize a high speed operation and size down the system, there has been adopted a system LSI to construct one system on one semiconductor chip. As a semiconductor memory device which is applied to such a system LSI, a logic merged memory (eRAM; embedded RAM) is available.

FIG. 24 is a diagram schematically showing an example of a configuration of a conventional logic merged memory. In FIG. 24, the logic merged memory includes a logic circuit LG and a memory circuit MK integrated on a semiconductor chip CHI. Logic circuit LG and memory circuit MK are interconnected by on-chip internal interconnection lines IL. Memory circuit MK is constituted of a DRAM. Logic circuit LG performs transmission/reception of data with an external device and memory circuit MK can be accessed only by logic circuit LG (in a normal operation). In the normal operation, the external device cannot access memory circuit MK directly.

In this logic merged memory, logic circuit LG and memory circuit MK are interconnected by on-chip internal interconnection lines IL. Internal connection line IL is of a small load, thereby enabling a high speed transfer of a signal/data between logic circuit LG and memory circuit MK. Furthermore, since internal interconnection line IL is on-chip interconnection line, a data line transmitting data can be formed at an internal interconnection pitch without receiving an influence of a pitch condition on pin terminals. Therefore, a bit width of data transferred between logic circuit LG and memory circuit MK can be extended, thereby enabling a band width of data transfer to be extended. Accordingly, even with a high operating frequency of logic circuit LG, logic circuit LG can access memory circuit MK to receive necessary data therefrom to execute a prescribed process.

Furthermore, since logic circuit LG and memory circuit MK are integrated on the same semiconductor chip CHI, a system size is reduced, as compared with a case where logic circuit LG and memory circuit MK are separately mounted on a board.

In system LSI including the logic merged memory, other analog core circuits and other memories such as SRAM (static random access memory) and so on may be mounted on semiconductor chip CHI. The analog circuits includes, for example, circuits for processing an analog signal from a video camera, an analog/digital conversion circuit, a digital/analog conversion circuit and others.

In the logic merged memory, in order to simplify a fabrication process, internal components of logic circuit LG and memory circuit MK are fabricated in the same steps as much as possible.

In a case where memory circuit MK is a DRAM, word lines are configured according to a hierarchical word line scheme composed of main word lines and sub word lines, and the sub word lines are driven by sub word drivers.

When an operating frequency of logic circuit LG increases much more, however, an operating speed of memory circuit MK is also required to be higher with increase in the operating frequency of logic circuit MK. Therefore, in a case where sub word drivers are used, sub word lines SWL is required to be driven into a selected state at high speed. In order to drive sub word lines SWL into a selected state at high speed, possible consideration is that the division number on the memory sub blocks is increased to thereby decrease a length of a sub word line driven by one sub word driver. In this case, however, the number of sub word driver bands increases to increase a layout area of a memory array (a memory mat), thereby causing a problem of increase in chip area.

Furthermore, in the case where a word line shunt structure is applied, there arises a necessity of use of an interconnection layer different from a main word line and therefore, in the case where a metal interconnection line for use in forming a shunt is further to be provided, process steps of fabrication increase in number, resulting in a increased cost. Moreover, in the case where the number of metal interconnection layers increases, a difference in height between memory circuit MK and logic circuit LG becomes so large that correct patterning is ensured at a step portion (since a pattern variation occurs due to irregular reflection and so on of exposure rays in a photolithography step), which makes it difficult to arrange a new additional metal layer.

SUMMARY OF THE INVENTION

It is an object of the present invention to provide a semiconductor memory device capable of driving a word line into a selected state at high speed.

It is another object of the present invention to provide a semiconductor memory device capable of driving a word line into a selected state at high speed without providing an additional interconnection layer.

It is still another object of the present invention to provide a logic merged memory capable of driving a word line into a selected state at high speed.

A semiconductor memory device according to the present invention includes: a plurality of memory cells arranged in rows and columns; a plurality of sub word lines, provided corresponding to respective memory cell rows, each connecting to memory cells on a corresponding row; a plurality of main word lines, each provided corresponding to a prescribed number of sub word lines among the plurality of sub word lines, disposed in a first conductive layer, for transmitting a memory cell row select signal; a plurality of shunting interconnection lines, provided in a second conductive layer formed under the first conductive layer corresponding to the plurality of sub word lines, each for electrically connecting to a corresponding sub word line with prescribed intervals; and a plurality of sub word drivers, provided corresponding to the plurality of sub word lines, each for driving a corresponding sub word line and a corresponding shunting interconnection line into a selected state according to, at least, a row select signal on a corresponding main word line.

A shunting interconnection line is provided corresponding to a sub word line and a shunting interconnection line is electrically connected to a corresponding sub word line at prescribed intervals. By driving a sub word line and a corresponding shunting interconnection line with a sub word driver, the sub word line can be driven into a selected state at high speed. Since an occupancy area of the shunt region is small, an increase in chip area due to provision of shunt regions can be suppressed.

Furthermore, by use of the first level metal interconnection layer for the shunting interconnection lines, which is generally provided in an embedded memory without being positively utilized, no necessity arises for adding a new step of forming the shunting interconnection lines.

Moreover, by use of the first level interconnection layer for the shunting interconnection lines, a capacitive coupling between a shunting interconnection line and a main word line can be prevented, which enables the shunting interconnection line to be driven into a selected state at high speed reliably according to a row select signal, since second level metal interconnection line s transmitting data each are provided between a shunting interconnection line and a main word line.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 4A is a diagram schematically showing a configuration of one row block shown in FIG. 3, and FIG. 4B is a diagram showing an electrically equivalent circuit of a memory sub array shown in FIG. 4A;

FIG. 11 is a diagram schematically showing internal voltage transmission lines in the first embodiment of the present invention;

FIG. 12 is a diagram schematically showing a configuration of shunt interconnection line in a modification of the first embodiment of the present invention;

FIG. 13 is a diagram schematically showing another sectional configuration of a multilayer interconnection line structure of the first embodiment of the present invention;

DESCRIPTION OF THE PREFERRED EMBODIMENTS

[First Embodiment]

Figure 1:
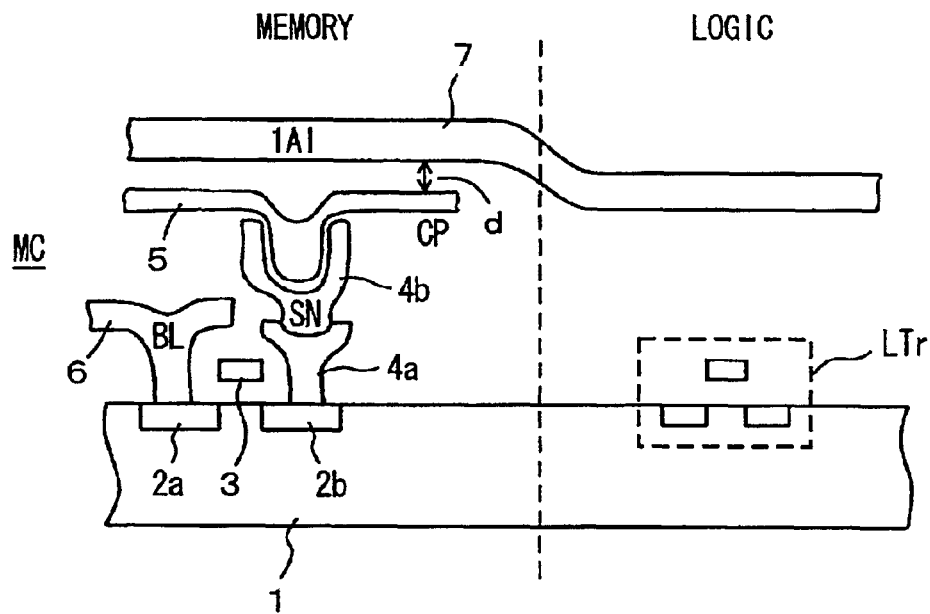
FIG. 1 is a diagram schematically showing a sectional structure of a memory cell of a semiconductor memory device according to the present invention.

FIG. 1 is a diagram schematically showing a sectional structure of a memory cell of a semiconductor memory device according to the present invention. The semiconductor memory device is an embedded memory integrated with a logic circuit on the same semiconductor chip.

In FIG. 1, a memory cell MC includes: impurity regions 2a and 2b, formed apart from each other on a surface of a semiconductor substrate region 1; a gate electrode 3 formed on a channel region between impurity regions 2a and 2b with an gate insulating film, not shown, laid thereunder; storage node electrodes 4a and 4b connected to impurity region 2b electrically and physically; and a cell plate electrode layer 5 placed facing to storage node electrode 4b with a capacitor insulating film, not shown, inserted in between. Impurity region 2a is connected to a conductive layer 6 serving as a bit line BL.

A first level aluminum interconnection line 7 is formed on cell plate electrode layer 5. The semiconductor memory device is an embedded memory formed on the same semiconductor substrate together with a logic, and the first level aluminum interconnection line including first level aluminum interconnection line 7 is also manufactured in a region where a logic circuit is formed in the same step. The first level aluminum interconnection layer is formed commonly over a semiconductor memory device (memory) and the logic circuit, and then is patterned into the first level aluminum interconnection line.

In memory cell MC shown in FIG. 1, an access transistor is formed of impurity regions 2a and 2b and gate electrode layer 3, and a memory cell capacitor is formed of storage node electrodes 4a and 4b, cell plate electrode layer 5 and the capacitor insulating film.

Storage node electrode 4b of the memory cell capacitor has a hollow cylindrical structure, in which a large side-wall surface is provided to increase an area facing cell plate electrode 5, thereby implementing a large capacitance value with a small occupancy area.

In a region where the logic is formed, a logic transistor LTr is formed on the surface of semiconductor substrate region 1. Semiconductor substrate region 1 on which a semiconductor memory device (a memory) and a logic (a logic circuit) are formed may be isolated using well regions and others. However, components of the semiconductor memory device and components of the logic circuit are formed in the same fabrication steps as much as possible. Therefore, the first level aluminum interconnection line including first level aluminum interconnection line 7 is extended over to the logic circuit from the semiconductor memory device, and desired interconnection patterns are formed through a patterning process and others.

Memory cell MC has a so-called stacked capacitor structure, in which storage node electrodes 4a and 4b are formed on the surface of substrate 1. Hence, a height difference arises between interconnection lines of the semiconductor memory device and the logic circuit by storage node electrodes 4a and 4b of the memory cell capacitor. In the case of a large height difference (step) between the interconnection lines, accurate patterning cannot be performed due to irregular reflection of exposure energy rays or the like in a photolithography step, so a necessity arise for reducing the height difference (step) to the possible smallest value. For example, in the semiconductor memory device, therefore, the following countermeasures are taken: A height of storage node electrode 4b in the stacked capacitor is reduced to some extent and a distance, d, between cell plate electrode 5 and first level aluminum interconnection line 7 is minimized to the possible smallest value.

Accordingly, since the distance between cell plate electrode layer 5 and first level aluminum interconnection line 7 is reduced, first level aluminum interconnection line 7 has not been used positively. In a conventional practice, first level aluminum line 7 was used, for example, as an interconnection line to reinforce a power supply for supplying an intermediate voltage to cell electrode layer 5. In the present invention, first level aluminum interconnection line 7 is used positively as a shunting interconnection line.

Figure 2:
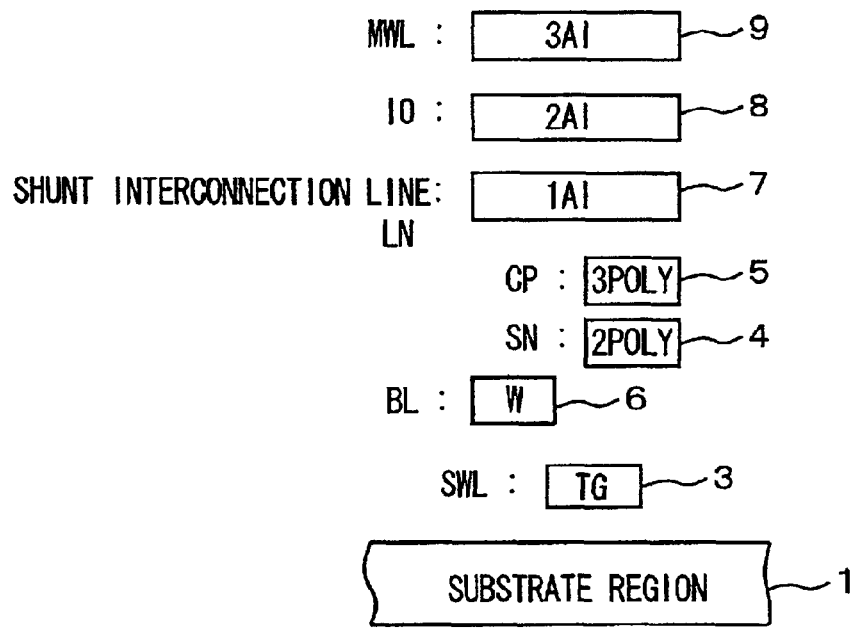
FIG. 2 is a diagram schematically showing an arrangement of interconnection layers of a semiconductor memory device according to the present invention.

FIG. 2 is a diagram schematically showing a cross sectional configuration of interconnection layers in a memory array section of a semiconductor memory device according to the present invention. Gate electrode layer 3 made of a first level polysilicon interconnection line (TG) is formed on substrate region 1. Gate electrode layer 3 functions as sub word line SWL.

Bit line conductive layer 6 made of tungsten W, for example is arranged in an upper layer of gate electrode layer 3. Storage node electrode layer 4 made of a second level polysilicon interconnection line (2POLY) 4 is formed on bit line conductive layer 6.

Cell plate electrode layer 5 made of, for example, a third level polysilicon layer (3POLY) is disposed above storage node electrode layer 4 serving as a storage node SN. Cell plate electrode layer 5 functions as a cell plate electrode CP of a memory cell capacitor to provide a reference potential for a stored charge on the memory cell capacitor.

In the memory cell capacitor, storage node electrode layers 4a and 4b may be made of the second level polysilicon interconnection line and the third level polysilicon interconnection line, respectively, and cell plate electrode layer 5 may be made of fourth level polysilicon interconnection line.

First level metal interconnection line (conductive layer) 7, which is first level aluminum interconnection line (1A1), is formed above cell plate electrode layer 5 serving as cell plate electrode CP. First level metal interconnection line 7 is used as a word line shunting interconnection line. Herein, while bit line conductive layer 6 is a metal interconnection line made of, for example, tungsten W, this tungsten interconnection layer is used for a bit line conductive line, and the tungsten interconnection line is of a single metal layer, and therefore, the tungsten interconnection layer is not counted as a layer for metal interconnection line and counting of layers are performed only on metal interconnection layers made of the same material. The number of levels is used for the number of the interconnection layer.

On first level metal interconnection line 7, a second level metal interconnection line (conductive layer) 8 is formed, which is, for example, second level aluminum interconnection line (2A1). Second level metal interconnection line 8 is used as an internal data line IO for transmitting data and further, used as a power supply reinforcement interconnection line for reinforcing a power supply line transmitting an array power supply voltage Vcc and a ground voltage.

On second level metal interconnection line 8, third level metal interconnection line (conductive layer) 9 is formed, which is, for example, third level aluminum interconnection line (3AL). Main word line MWL is made by third level metal interconnection line 9.

Therefore, by use of first level metal interconnection line 7, which was not positively used in a conventional practice, as a shunting interconnection line, a word line shunting structure can be implemented only by changing masks for patterning shunting interconnection lines without adding a manufacturing step.

In a general standard DRAM, main word lines MWL are made of first level metal interconnection line 7 and a double metal interconnection structure including second level metal interconnection line of the upper layer of the main word line is used, with bit lines excluded. In a case of such a double metal interconnection structure, a necessity arises for use of an additional interconnection layer in order to newly provide a shunting interconnection line. In this embedded memory according to the present invention, however, through positive use of the inherently arranged first level metal interconnection layer as an interconnection layer for forming a shunting interconnection line, a word line shunting technique is applied with ease to a word line structure of a hierarchical word drive scheme, thereby enabling sub word line SWL to be driven into a selected state at high speed.

Figure 3:
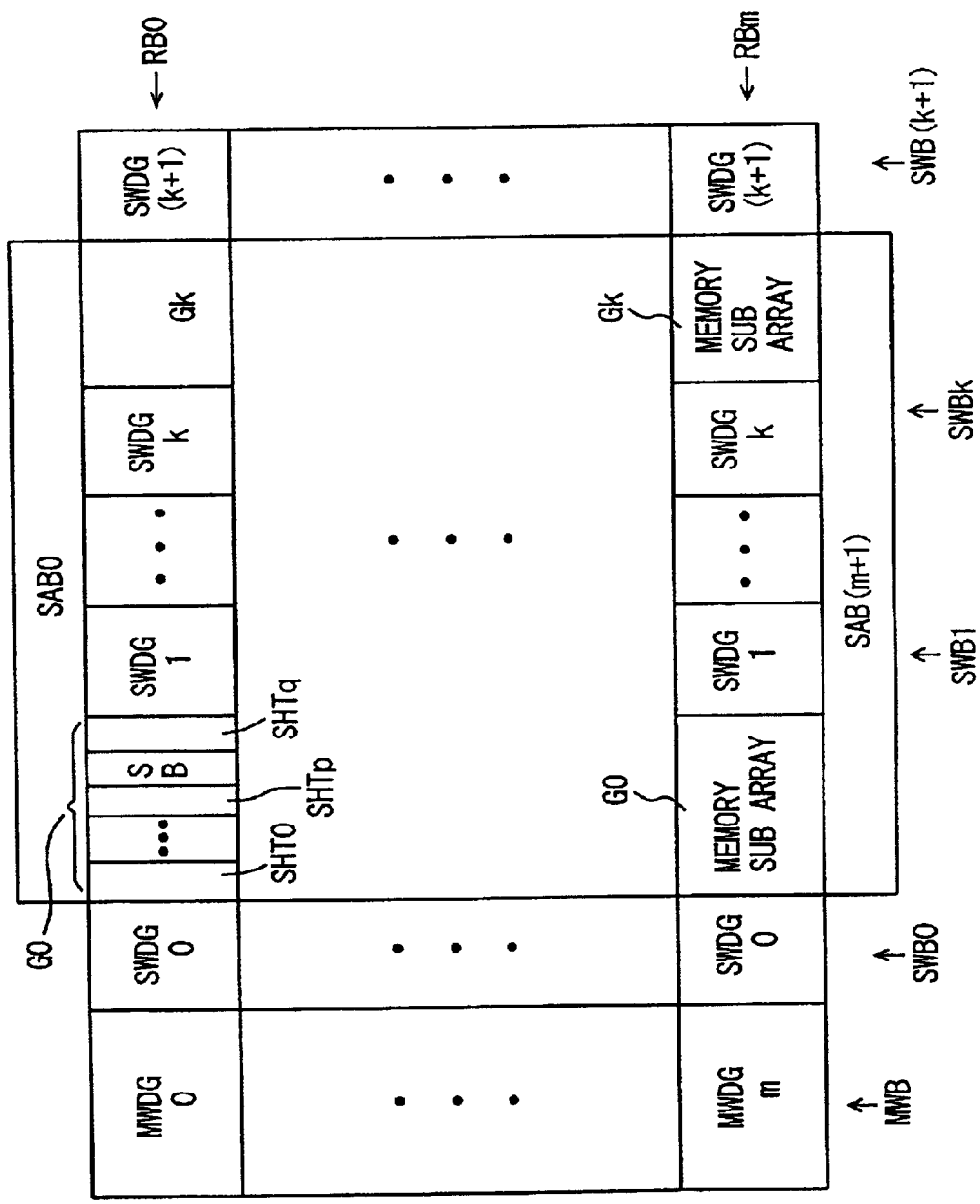
FIG. 3 is a diagram schematically showing a configuration of a memory mat of a semiconductor memory device according to a first embodiment of the present invention.

FIG. 3 is a diagram schematically showing a configuration of a memory mat according to a first embodiment of the present invention. In FIG. 3, a memory mat is divided into a plurality of row bocks RB0 to RBm along the column direction. Each of row blocks RB0 to RBm is divided into plural memory sub arrays S0 to Gk by sub word driver bands SWB0 to SWB(K+1).

In sub word driver bands SWB0 to SWB(K+1), sub word driver groups SWDG0 to SWDG(k+1) are provided corresponding to the row blocks RB0 to RBm. In sub word driver groups SWDG0 to SWDG(K+1), sub word drivers are provided corresponding to the respective sub word lines. Sense amplifier bands SAB0 to SAB(m+1) are provided correspondingly to respective row blocks RB0 to RBm. Sense amplifier bands SAB0 to SAB(m+1) each have a so-called shared sense amplifier structure and shared by adjacent row blocks.

Main word driver groups MWDGo to MWDGm are provided corresponding to row blocks RB0 to RBm. Main word driver groups MWDGo to MWDGm are aligned in a main word driver band MWB along the column direction. Each of main word driver groups MWDGo to MWDGm includes main word drivers provided corresponding to the respective main word lines.

Each of memory sub arrays G0 to Gk is divided into a plurality of sub blocks SB by shunt regions SHT0 to SHTq. In each of shunt regions SHT0 to SHTq, a shunting interconnection line and a sub word line are electrically connected to each other. Sub word lines are driven by respective sub word drivers into a selected state according to the signals on corresponding main word lines and a sub decode signal, and in addition, the shunting interconnection line is driven by a sub word driver. Therefore, the sub word line is also driven into a selected state according to a signal on the shunting interconnection line. Thus, in the case where sub word line SWL is made of first level polysilicon (TG) and has a relatively high resistance as well, a resistance value thereof can be reduced equivalently with the help of the shunting interconnection line, thereby, enabling sub word line SW to be driven into a selected state at higher speed.

FIG. 4A is a diagram schematically showing a configuration including main word line MWL, a shunt interconnection line (lining interconnection line) and sub word lines in one row block. In FIG. 4, memory sub arrays G0 to G2 in one row block are shown representatively. Main word line MWL is provided commonly to memory sub arrays G0 to G2. A main word line drive signal from main word driver MWD is transmitted onto main word line MWL.

Sense amplifier groups SAGU0 and SAGL0 are provided on both sides of memory sub array G0 in the column direction and sense amplifier groups SAGU1 and SAGL1 are provided on both sides of memory sub array G1 in the column direction. Sense amplifier groups SAGU2 and SAGL2 are provided on both sides of memory sub array G2 in the column direction.

Memory sub arrays G0 to G2 are separated by sub word driver bands SWB1 and SWB2. Sub word driver bands SWB0 and SWB3 are provided on the outsides of respective memory sub arrays G0 and G2. Sub word lines SWL00, SWL01 and SWL02 are provided in respective memory sub arrays G0 to G2. Sub word lines SWL00, SWL01 and SWL02 are aligned in the row direction, and each of the subs word lines is extended in a corresponding memory sub array in the row direction and connected to memory cells on a corresponding row in the corresponding memory sub array.

Shunt regions SHT are provided in each of memory sub arrays G0 to G2, and each of the shunt regions divides each memory sub array into memory sub blocks SB. In FIG. 4A, a exemplary state is shown in which each of memory sub arrays G0 to G2 is divided into 4 memory sub blocks by three shunt regions. That is, memory sub array G0 is divided into memory sub blocks SB0 to SB3, memory sub array G1 is divided into memory sub blocks SB4 to SB7 and memory sub array G2 is divided into memory sub blocks SB8 to SB11.

In memory sub arrays G0 to G2, shunting interconnection lines LN0, LN1 and LN3 are provided corresponding to respective sub word lines SWL00, SWL01 and SWL02. Shunting interconnection lines LN0, LN1 and LN3 are formed of the first level metal interconnection lines, which are, for example, the first level aluminum interconnection lines. On the other hand, main word line MWL is formed of the third level metal interconnection line, which is, for example, the third level aluminum interconnection line.

Shunting interconnection lines LN0, LN1 and LN3 are electrically short-circuited to respective sub word lines SWL00, SWL01 and SWL02 in shunt regions SHT in corresponding memory sub arrays G0 to G2 through contacts CNT. Both ends of each of sub word lines SWL00, SWL01 and SWL02 are coupled to corresponding ends of corresponding one of shunt interconnection lines LN0, LN1 and LN3 through contacts CNT. Contacts CNT connected to both ends of each of sub word lines SWL00, SWL01 and SWL02 are provided in respective sub word driver bands SWB0, SWB1 and SWB3. By connecting sub word lines SWL and shunting interconnection lines LN electrically at both ends with each other, a drive signal transmitted from corresponding sub word driver SWD through shunting interconnection lines LN can be transmitted to an end thereof and thereafter, the drive signal can be further transmitted from the end of sub word line SWL, thereby enabling the sub word line disposed on a selected row to be driven into a selected state at high speed.

Only contacts CNT are disposed in shunt regions and the areas occupied by shunt regions SHT can be sufficiently smaller than an areas in which sub word drivers SWD are provided. Thus, a sub word line can be driven into a selected state at high speed, while suppressing increase in array area sufficiently, while.

Sub word drivers SWD are disposed on rows alternately in each of sub word driver bands SWB0 to SWB3.

FIG. 4B is a diagram showing an electrically equivalent circuit corresponding to the configuration of sub word lines and shunting interconnection lines shown in FIG. 4A. FIG. 4B shows sub word lines SWL arranged on two rows. Sub word drivers are provided in respective sub word driver bands SWB0 to SWB3 alternately on two rows. Sub word driver SWD drives sub word line SWL and a corresponding shunting interconnection line LN disposed in one memory sub array into a selected state. Sub word driver SWD drives a corresponding sub word line and a corresponding shunting interconnection line into a selected state according to a signal on a corresponding main word line MWL and sub decode signal SD (complementary sub decode signals SD and ZSD).

Shunting interconnection lines LN are provided corresponding to sub word lines SWL in respective memory sub arrays G0 to G2. Shunting interconnection lines LN and corresponding sub word lines SWL are electrically short-circuited to each other at contacts CNT in shunt regions SHT. Each of shunting interconnection lines LN and a corresponding one of sub word lines SWL are electrically connected by contacts CNT at both ends thereof with each other.

Now, resistance values of sub word lines SWL and shunting interconnection lines LN in one memory sub blocks B are assumed as Rs and r1, respectively. Shunting interconnection line LN is connected to a corresponding sub word line SWL through contacts CNT in shunt regions. Therefore, an electrically equivalent resistance value of sub word line SWL in one memory sub block is given by $1/(1/Rs+1/r1)$. Shunting interconnection line LN is formed of the first level metal interconnection line, which is, for example, the first level aluminum interconnection line, and the resistance value r1 thereof is sufficiently smaller than that of a gate interconnection line (the first level polysilicon interconnection line) constituting sub word line SWL. Therefore, an electrically equivalent resistance value of sub word line SWL in memory sub blocks B can be substantially r1, thereby enabling sub word line SWL to be driven into a selected state at high speed according to an output signal of sub word driver SWD.

Particularly, by electrically connecting shunting interconnection line LN and sub word line SWL at both ends with each other, electrically equivalent resistance values of sub word lines can be all the same with each other, which enables sub word lines to be driven into a selected state at high speed. For example, in the case where, in a memory sub block, each of shunting interconnection lines LN and corresponding one of sub word lines SWL are not interconnected together at both ends of each line through contacts CNT, an electrically equivalent resistance value of the sub word line in the memory sub block is not reduced by shunting interconnection line LN, and therefore, a propagation delay of a signal occurs due to a resistance Rs of sub word line SWL. By connecting a sub word line and each respective shunting interconnection line with each other at both ends, an electrically equivalent resistance value of sub word line SWL in each memory sub block can be reduced, thereby enabling sub word line SWL to be driven into a selected state at high speed.

No sub word driver SWD is disposed in regions where an end of shunting interconnection line LN and an end of sub word line SWL are connected in each respective sub word driver band. Therefore, an end of sub word line SWL and an end of a corresponding shunting interconnection line LN can be electrically connected to each other using contact CNT with a sufficient area margin.

Even in the case where an output of sub word driver SWD is transmitted to shunting interconnection line LN and sub word line SWL, only one contact region is additionally disposed for each sub word line in sub word driver band SWB. Therefore, contacts CNT for shunting interconnection lines can be formed with a sufficient area margin in a region where sub word drivers are disposed.

Figure 5:
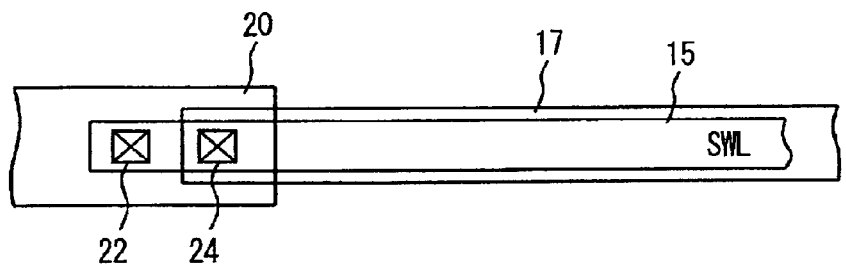
FIG. 5 is a diagram schematically showing contacts between a sub word line and a shunting interconnection line in the first embodiment of the present invention.

FIG. 5 is a diagram schematically showing an example of an arrangement of contacts in an output section of a sub word driver. In FIG. 5, a conductive layer 20 through which an output of sub word driver SWD is transmitted is electrically connected to a conductive layer 15 serving as sub word line SWL through a contact 22. Conductive layer 20 is further connected to a shunting interconnection line 17 in an upper layer, not shown, through a contact 24. Conductive layer 20 through which an output of sub word driver SWD is transmitted may be formed using, for example, a conductive layer (a tungsten layer) constituting a bit line. Alternatively, conductive layer 20 may be constituted of the second level polysilicon interconnection line. Shunting interconnection line 17 and conductive layer 15 serving as sub word line SWL are electrically connected to each other with conductive layer 20 interposed in between, and therefore, a contact region in a shunt region can be of the same structure as that of a contact region in a sub word driver band.

Note that in the contact arrangement shown in FIG. 5, contacts 22 and 24 are aligned along a direction along which sub word line SWL extends. Contacts 22 and 24, however, may be aligned along a direction perpendicular to sub word line SWL. Arrangement of contacts 22 and 24 has only to be determined appropriately, depending on a pattern of the output of sub word driver SWD.

Figure 6:
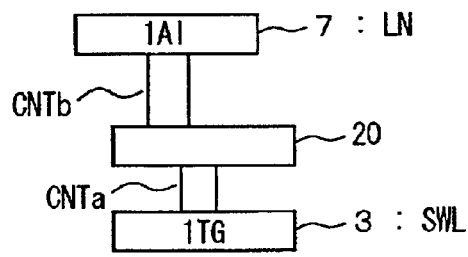
FIG. 6 is a diagram schematically showing a structure of a word line shunting portion according to the first embodiment of the present invention.

FIG. 6 is a diagram schematically showing a cross sectional structure of contacts in the shunt region. An interconnection line (conductive layer) 3 constituting sub word line SWL is connected to an intermediate conductive layer 20 through a contact CNTa. Intermediate conductive layer 20 is connected to a first level metal interconnection line (conductive layer) 7 serving as shunting interconnection line LN through a contact CNYb. Intermediate conductive layer 20 is the same layer as conductive layer 20 through which an output of sub word driver SWD shown in FIG. 5 is transmitted, and therefore, contacts between sub word line SWL and shunting interconnection line LN can be all of the same structure.

Contacts CNTa and CNTb each are a kind of low resistance metal interconnection line and have only to be made of a material with which contact holes are sufficiently filled and which can make an electric connection to a corresponding conductive layer. Furthermore, contact CNTa and CNTb may be made of any of tungsten, aluminum and polysilicon.

By inserting intermediate conductive layer 20 to form a contact between shunting interconnection line LN and sub word line SWL, an aspect ratio of a contact in the shunt region can be small, thereby enabling shunting interconnection line LN and sub word line SWL to be electrically short-circuited accurately.

Furthermore, by use of the first level metal interconnection line as shunting interconnection line LN, the following advantage can also be achieved.

Figure 7A:
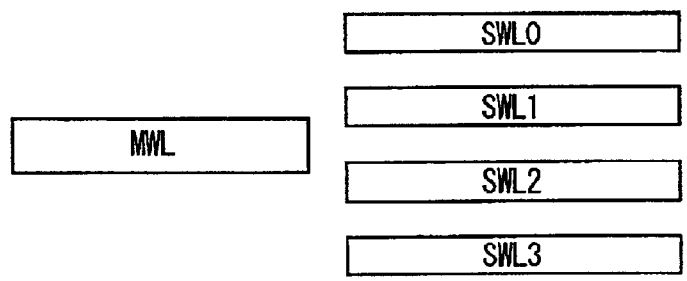
FIG. 7A is a diagram schematically showing a correspondence between a main word line and sub word lines.

As shown in FIG. 7A, generally, plural sub word lines SWL are arranged for a main word line MWL. In the configuration shown in FIG. 7A, 4 sub word lines SWL0 to SWL3 are arranged for one main word line MWL. One of sub word lines SWL0 to SWL3 is selected by a sub decode signal. Shunting interconnection lines LN are arranged in an upper layer above sub word lines SWL0 to SWL3 at the same pitches. In the case where main word line MWL is driven into a selected state, one of shunting interconnection lines LN is driven into a selected state with the remaining of the sub word lines in a set are kept in a non-selected state. In this case, a possibility arises that a potential of a non-selected sub word line rises through shunting interconnection line LN through a capacitive coupling between main word line MWL and shunting interconnection line LN.

Figure 7B:
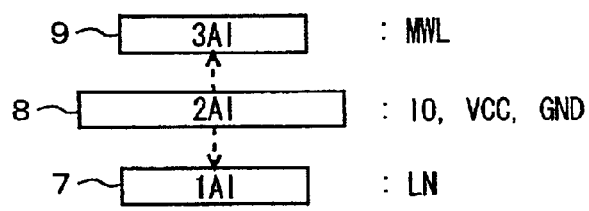
FIG. 7B is a diagram showing a configuration of a main word line and a shunt interconnection line.

As shown in FIG. 7B, however, shunting interconnection line LN is the first level metal interconnection line 7, which is, for example, the first level aluminum interconnection line, while main word line MWL is of, for example, third level aluminum interconnection line 9. Second level metal interconnection line 8, such as the second level aluminum interconnection line, is provided between main word line MWL and shunting interconnection line LN. Second level metal interconnection line 8 is used as an internal data line IO or an interconnection line for transmitting power supply voltage VCC/ground potential GND. Upon word line selection, internal data line IO is usually in a precharged state or in a definite potential state according to transmission data thereon. In a case of a power supply line for transmitting ground potential GND or power supply voltage VCC, second level metal interconnection line 8 has a fixed voltage level.

Therefore, second level metal interconnection line 8 functions as a shield layer to prevent a capacitive coupling between main word line MWL and shunting interconnection lines 7 and 9. By use of first level metal interconnection line as shunting interconnection line LN, capacitive coupling between main word line MWL and shunting interconnection line LN can be prevented from occurring, which can make shunting interconnection line LN to be correctly driven according to an output signal of sub word driver SWD.

Figure 8:
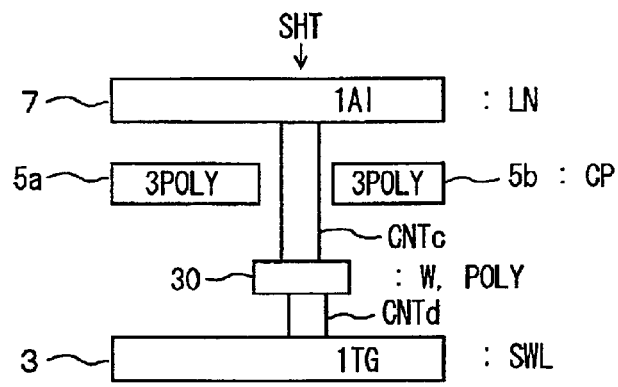
FIG. 8 is a diagram more specifically showing a sectional configuration of a word line shunting portion in the first embodiment of the present invention.

FIG. 8 is a diagram schematically showing a cross sectional configuration of a word line shunt portion. In the shunt portion of FIG. 8, a cell plate electrode layer (CP) is divided into cell plates electrode layer 5a and 5b. Cell plate electrode layers 5a and 5b are made of, for example, the third level polysilicon interconnection lines. In shunt region SHT, contact CNTc is formed passing through a region separating cell plate electrodes 5a and 5b from each other to electrically connect first level aluminum interconnection line 7 and intermediate conductive layer 30 to each other. First level aluminum interconnection line 7 is shunting interconnection line LN. Intermediate conductive layer 30 is formed to reduce an aspect ratio of each of the contacts and may be made in the same layer as a bit line or in the same layer as a storage node electrode layer. Intermediate conductive layer 30 is electrically connected to first level polysilicon interconnection line 3 constituting sub word line SWL through contact CNTd.

Hence, in shunt region SHT, since no memory cell is disposed, no problem arises even when cell plate CP is divided in the word line shunt region. Cell plate electrode CP may be of a divided structure in each shunt region SHT and furthermore, in shunt region SHT, contacts may also be formed at pitches of sub word lines SWL and shunting interconnection lines LN. In any of the structures, a resistance value of cell plate electrode CP increases in shunt region SHT.

Figure 9:
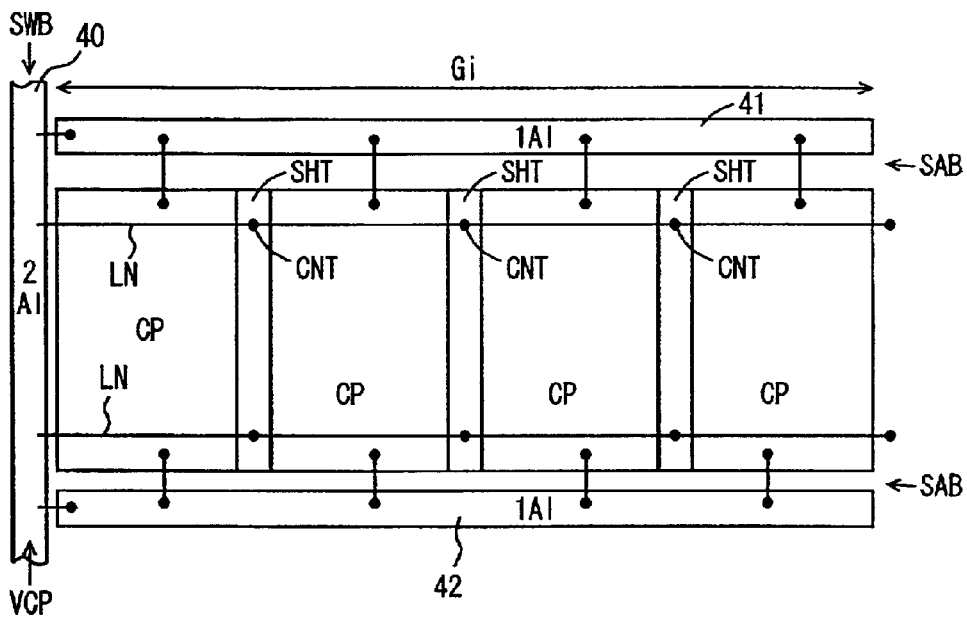
FIG. 9 is a diagram schematically showing a layout of a cell plate voltage transmission section.

FIG. 9 is a diagram schematically showing an example of an arrangement of cell plate electrodes. In FIG. 9, there is shown an arrangement of cell plate electrodes CP in one memory sub array Gi.

In the arrangement shown in FIG. 9, cell plate electrodes CP are separated by shunt regions SHT. In shunt region SHT, contacts CNT are formed corresponding to respective shunting interconnection lines LN and electrically connected to sub word lines in the lower layer. Therefore, in shunt region SHT, cell plate electrode CP occupies a small area even when each cell plate electrode CP is of a continuous structure, to increase a resistance value thereof, while in the case of a divided structure, a resistance value thereof increases to infinity.

In order to supply a cell plate voltage at an intermediate voltage level to cell plate electrode CP, an intermediate voltage transmission line 40 formed of the second level aluminum interconnection line is provided in sub word driver band SWD to transmit a cell plate voltage VCP. Intermediate voltage transmission line 40 is electrically coupled to sub-intermediate voltage transmission lines 41 and 42, constituted of first level aluminum interconnection line, and extending in the row direction in respective sense amplifier bands SAB. Sub-intermediate transmission lines 41 and 42 are formed of first level aluminum interconnection lines and electrically connected to corresponding cell plate electrodes CP.

In sense amplifier band SAB as well, no memory cell is provided, and therefore, sub-intermediate voltage transmission lines 41 and 42 can be disposed without exerting an adverse influence on a pitch condition on shunt interconnection lines LN using first level aluminum interconnection lines. Owing to such arrangement, a cell plate voltage VCP can be transmitted to each cell plate electrode CP using sub-intermediate voltage transmission lines 41 and 42 constituted of first level aluminum interconnection line, thereby enabling cell plate voltage VCP to be stably supplied to cell plate electrodes CP without undergoing an influence of a shunt structure.

Figure 10:
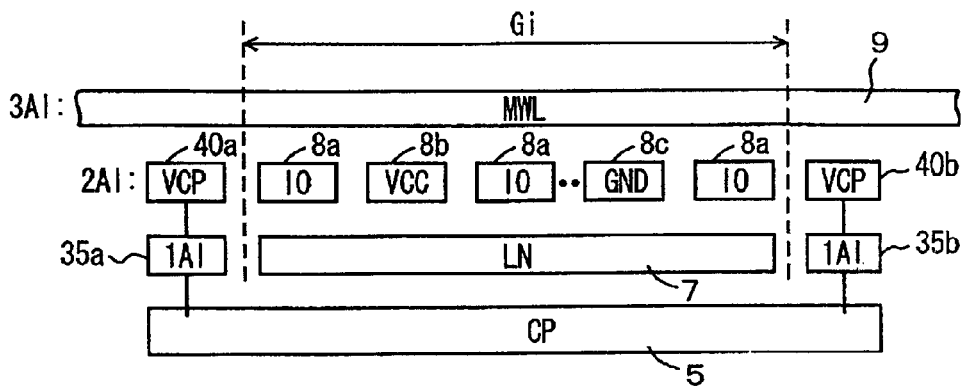
FIG. 10 is a diagram schematically showing a sectional configuration of the layout of interconnection line in the layout shown in FIG. 9.

FIG. 10 is a diagram showing an example of a cross sectional configuration of the arrangement of interconnection lines shown in FIG. 9. Third level aluminum interconnection line 9 constituting main word line MWL is provided in third level aluminum interconnection layer. Second level metal interconnection lines constituted of, for example, second level aluminum interconnection lines are formed under third level metal interconnection layer 9. In second level metal interconnection layer, a conductive layer 8a for constituting an IO line transmitting internal data, a power supply line 8b transmitting power supply voltage VCC and a ground line 8c transmitting ground voltage GND are extended in the row direction on memory sub array Gi. In regions of sub word driver bands outside memory sub array Gi, intermediate voltage transmission lines 40a and 40b transmitting cell plate voltage VCP are disposed.

In first level aluminum interconnection layer, first level metal interconnection line 7 serving as shunting interconnection line LN is extended in the row direction under second level metal interconnection lines 8a, 8b and 8c in memory sub array Gi. In sense amplifier bands outside memory sub array Gi, first level metal interconnection lines 35a and 35b formed in first level aluminum interconnection layer are disposed and electrically connected to intermediate voltage transmission lines 40a and 40b at the upper layer. First level metal interconnection lines 35a and 35b are electrically connected to third level polysilicon interconnection line 5 constituting cell plate CP at the lower layer thereof. Therefore, first level metal interconnection lines 35a and 35b transmitting intermediate voltage VCP are not provided in memory sub array Gi, while first level metal interconnection lines 35a and 35b transmitting intermediate voltage (cell plate voltage) VCP are provided only in sub word driver band SWB and sense amplifier band SAB, thereby enabling an intermediate voltage power supply to be reinforced without exerting an adverse influence on a layout of shunting interconnection lines LN.

FIG. 11 is a diagram schematically showing an arrangement of voltage transmission lines on memory mat MM. Cell plate voltage VCP from a VCP generation circuit 45 generating cell plate voltage VCP is transmitted surrounding memory mat MM by way of an intermediate voltage transmission line 50 constituted of second level aluminum interconnection line. Intermediate voltage transmission line 50 is coupled to sub-intermediate voltage transmission lines 51 extending in the row direction and furthermore, to sub-intermediate voltage transmission lines 52 in the column direction. Sub-intermediate voltage transmission lines 51 are constituted of, for example, first level aluminum interconnection lines and disposed in respective sense amplifier bands. On the other hand, sub-intermediate voltage transmission lines 52 are disposed in respective sub word driver bands and constituted of, for example, second level aluminum interconnection lines.

A power supply line 60 transmitting power supply voltage VCC and ground voltage GND is disposed on memory mat MM or in such a manner of surrounding memory mat MM. Power supply line 60 is coupled to sub-power supply lines 61 constituted of, for example, first level aluminum interconnection lines in the row direction, and furthermore, to sub-power supply lines 62 constituted of, for example, second level aluminum interconnection lines in the column direction. In memory mat MM, power supply voltage VCC and ground voltage GND used by sense amplifiers can be stably supplied.

In parallel to sub-power supply lines 62, internal data lines 65 transmitting internal data are extended in the column direction. Internal data lines 65 are extended over memory mat and an arrangement region of the internal data lines is not limited on sense amplifier bands. Therefore, even in a case where the number of bits of internal data is large as in a case of an embedded memory, internal data with a large bit width can be transferred.

Note that in the configuration and arrangement shown in FIGS. 10 and 11, intermediate voltage transmission lines 40, 41*a* and 40*b*, and sub-intermediate voltage transmission lines 52 are disposed in sub word driver bands and constituted of second level aluminum interconnection lines. If a space is available on memory sub array, however, intermediate voltage transmission lines 52 constituted of second level aluminum interconnection lines may be extended in the column direction over a memory sub array.

As shown in FIG. 11, by arranging interconnection lines transmitting cell plate voltage VCP, power supply voltage VCC and ground voltage GND in a meshed shape, the power supplies can be reinforced without exerting no influence on a layout pitch of internal signal interconnection lines.

[Modification]

FIG. 12 is a diagram showing a modification of shunting interconnection lines. In FIG. 12, shunting interconnection lines are formed of copper interconnection lines 72 deposited between insulating films 70. That is, an insulating film 70 as formed is patterned to form regions for shunting interconnection lines at sub word line pitches and then, shunting interconnection line regions are filled with copper and resultant copper films are used as interconnection layers (lines) 72. In a case where copper interconnection lines are used as shunting interconnection lines, copper interconnection lines have a strong resistance against electro-migration or a stress migration, thereby enabling a cross sectional area of each interconnection line to be small, and also arrangement of interconnection lines adapting to a narrow pitch of sub word lines.

FIG. 13 is a diagram schematically showing a cross sectional configuration of interconnection lines in a case where copper interconnection lines are used as interconnection lines. In FIG. 13, a first level copper interconnection line 80 is used as shunting interconnection line LN. A second level copper interconnection line 81 is used as internal data line (IO) and an intermediate voltage transmission line transmitting cell plate voltage VCP. A third level copper interconnection line 82 is used as main word line MWL. A fourth level copper interconnection line 83 is used as power supply lines transmitting power supply voltage VCC and ground voltage GND.

In a case of such a four level metal interconnection layer structure (except a bit line), as well, by use of first level copper interconnection line 80 closest to cell plate electrode as shunting interconnection line LN, there can be obtained an effect similar to a case where aluminum interconnection line is used. Furthermore, in a case where copper interconnection lines are used, shunting interconnection lines can be disposed at the same pitches as the sub word lines reliably.

As described above, according to the first embodiment of the present invention, since sub word lines are fabricated using not only a shunt structure but also a hierarchical word line structure, a sub word line can be driven into a selected state at high speed while suppressing increase in occupancy area of a memory mat.

Furthermore, since an existing interconnection layer is used for shunting interconnection lines, a hierarchical word line structure and a word line shunt structure can be implemented without increasing the number of manufacturing steps.

Especially, in an embedded memory, by use of both of a hierarchical word line structure and a word line shunt structure and furthermore by positive utilization of first level metal interconnection lines, there can be implemented an embedded memory capable of performing a high speed access.

[Second Embodiment]

Figure 14:
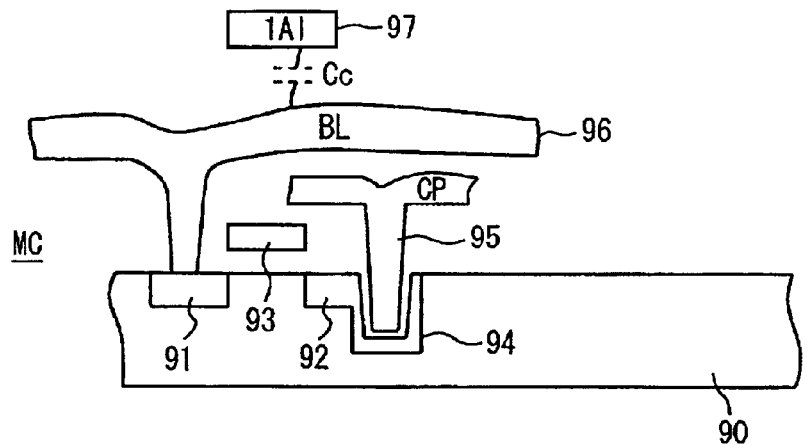
FIG. 14 is a diagram schematically showing a sectional configuration of a memory cell of a semiconductor memory device in a second embodiment of the present invention.

FIG. 14 is a diagram schematically showing a cross sectional configuration of a memory cell according to the second embodiment of the present invention. In FIG. 14, a memory cell MC includes: impurity regions 91 and 92 formed on a surface of a semiconductor substrate region 90; a gate electrode layer 93 formed on a channel region between impurity regions 91 and 92 with a gate insulating film, not shown, laid thereunder; a trench region 94 electrically connected to impurity region 92; and cell plate electrode 95 disposed facing trench region 94 with a capacitor insulating film, not shown, interposed in between. Impurity region 91 is electrically connected to a conductive layer constituting a bit line BL.

The structure of memory cell MC shown in FIG. 14 is a so-called trench capacitor structure. A memory capacitor is constituted of facing surfaces of cell plate electrode 95 in trench region 94 and a trench through the capacitor insulating film. In a case of the trench capacitor structure, a conductive layer 96 serving as a bit line BL is disposed in an upper layer of cell plate electrode layer 95 (CP). A first level metal interconnection line 97 is provided above bit line conductive layer 96 and used as shunting interconnection lines.

In a case of the trench capacitor structure, dissimilar to a stacked capacitor structure, a height of semiconductor substrate region 90 is sufficiently low, and therefore, a sufficient distance are ensured between a conductive layer serving as a bit line and first level metal interconnection line 9. Thereby, a sufficiently small capacitive coupling is implemented. Therefore, in a case where first level metal interconnection line 97 is used as a shunting interconnection line, a coupling capacitance Cc between conductive layer 96 serving as a bit line and first level metal interconnection line 97 can be made small, thereby enabling transmission of a word line drive signal onto a corresponding sub word line at high speed.

In the above structure, a trench capacitor structure is employed. However, a capacitor structure called a capacitor under bit line (CUB) structure may be used. In a case of the CUB structure, a protruded region is formed on a semiconductor substrate region instead of a trench and the protruded region is used as a storage node. A cell plate electrode is provided under a bit line. Therefore, in a case of a memory cell having a capacitor of such a CUB structure, by use of first level metal interconnection line as shunting interconnection line, a parasitic capacitance of a shunting interconnection line can be made small, which enables a sub word line to be driven into a selected state at high speed.

As described above, according to the second embodiment of the present invention, a memory cell structure in which a cell plate electrode is disposed under a bit line and an interconnection line in an upper layer thereof is used as a shunting interconnection line, which enables a parasitic capacitance of the shunting interconnection line to be reduced and furthermore, enables a sub word line to be driven into a selected state at high speed.

Note that in the second embodiment, the structure of the other part than the memory cell structure is similar to that of the structure of the first embodiment.

[Third Embodiment]

Figure 15:
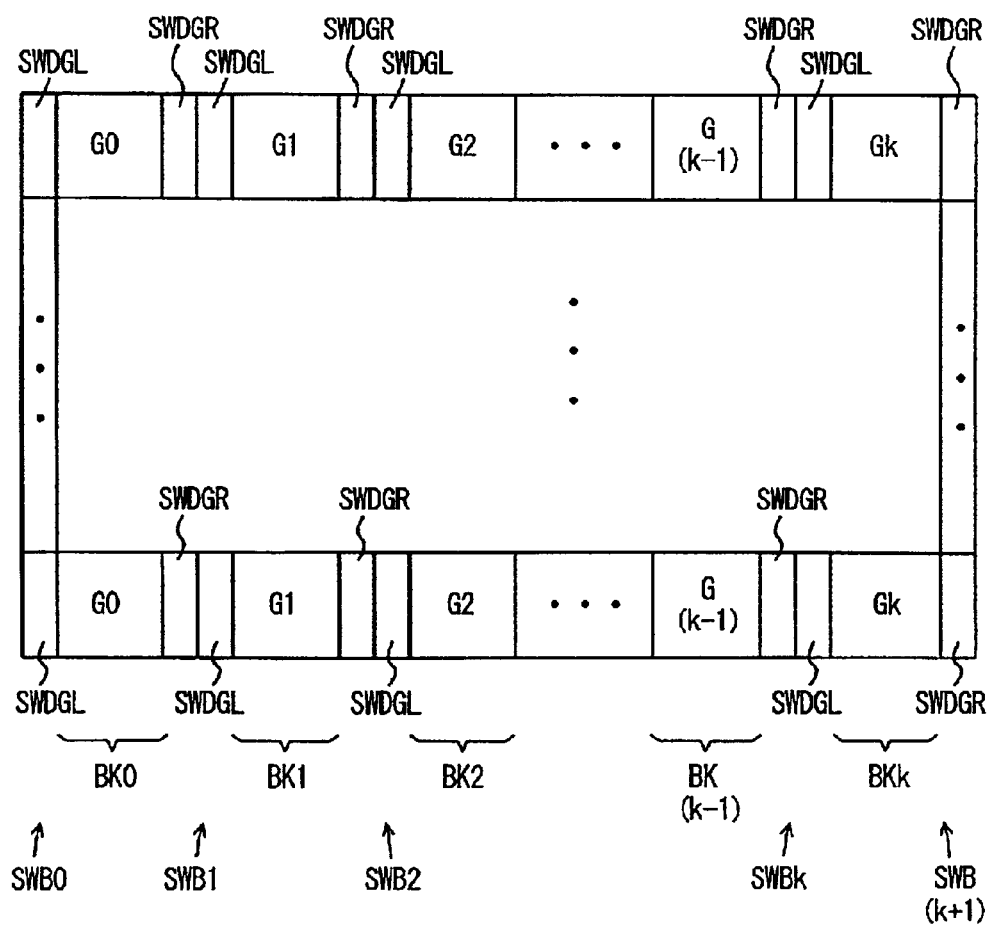
FIG. 15 is a diagram schematically showing a configuration of a memory mat according to a third embodiment of the present invention.

FIG. 15 is a diagram schematically showing a configuration of a memory mat according to a third embodiment of the present invention. The memory mat shown in FIG. 15 is divided into plural row blocks, similar to the first embodiment. Each row block are divided into memory sub arrays G0 to Gk by sub word driver bands SWB1 to SWBk. Sub word driver bands SWB0 and SWB (k+1) are provided outside respective memory sub arrays G0 and Gk.

Sub word driver groups SWDGR and SWDGL are disposed in each of sub word driver bands SWB1 To SWBk. Sub word driver groups SWDGR and SWDGL are independently driven. In one memory sub array Gi, sub word lines are driven by sub word drivers of sub word driver groups SWDGL and SWDGR provided alternately on both sides thereof.

In a case of a configuration of the memory mat shown in FIG. 15, memory sub arrays aligned in the column direction constitute one bank. That is, in the case of the configuration of the memory mat shown in FIG. 15, banks BK0 to BKk are formed. Each of memory sub arrays G0 to Gk are further divided into plural memory sub blocks SB by shunt regions, similar to the first embodiment.

In the case of the configuration of the memory mat shown in FIG. 15, one memory mat can be divided into plural banks and different pages (sub word lines) in each bank can be held in a selected state, thereby enabling operations of banks in an interleaved manner and thus implementation of high speed access without causing an overhead in changing pages.

In such a configuration in which a memory mat is divided into plural banks, by driving a selected sub word line into a selected state at high speed, banks can be sequentially accessed at high speed. Therefore, in memory sub blocks G0 to Gk, by use of both of a hierarchical word line structure and a word line shunt structure, a time required for sub word line selection can be made shorter, which enables a different bank to be driven into a selected state in parallel during a column access to one bank and thus, banks can be sequentially accessed even if a column access time is short for the one bank.

Figures 16A, 16B:
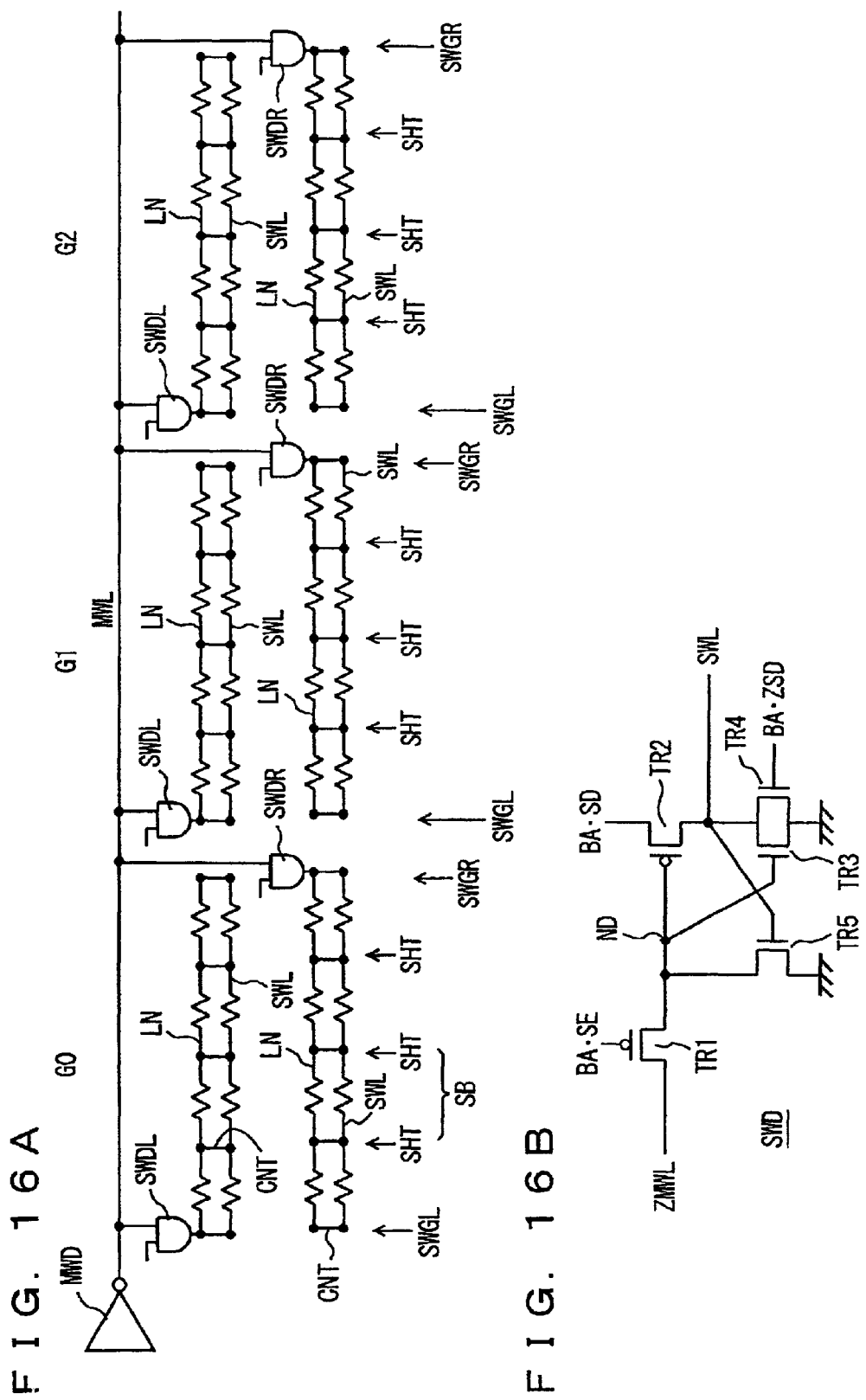
FIG. 16A is a diagram schematically showing an electrically equivalent circuit of a configuration of a memory sub array shown in FIG. 15.
FIG. 16B is a diagram showing an example of a configuration of a sub word driver shown in FIG. 16A.
Figure 17A:
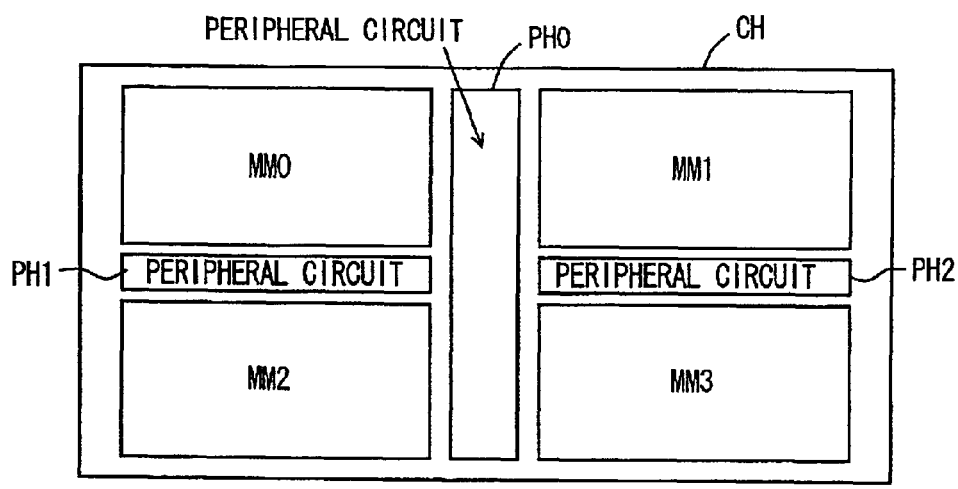
FIG. 17A is a diagram showing an arrangement of memory mats of a conventional DRAM.
Figure 17B:
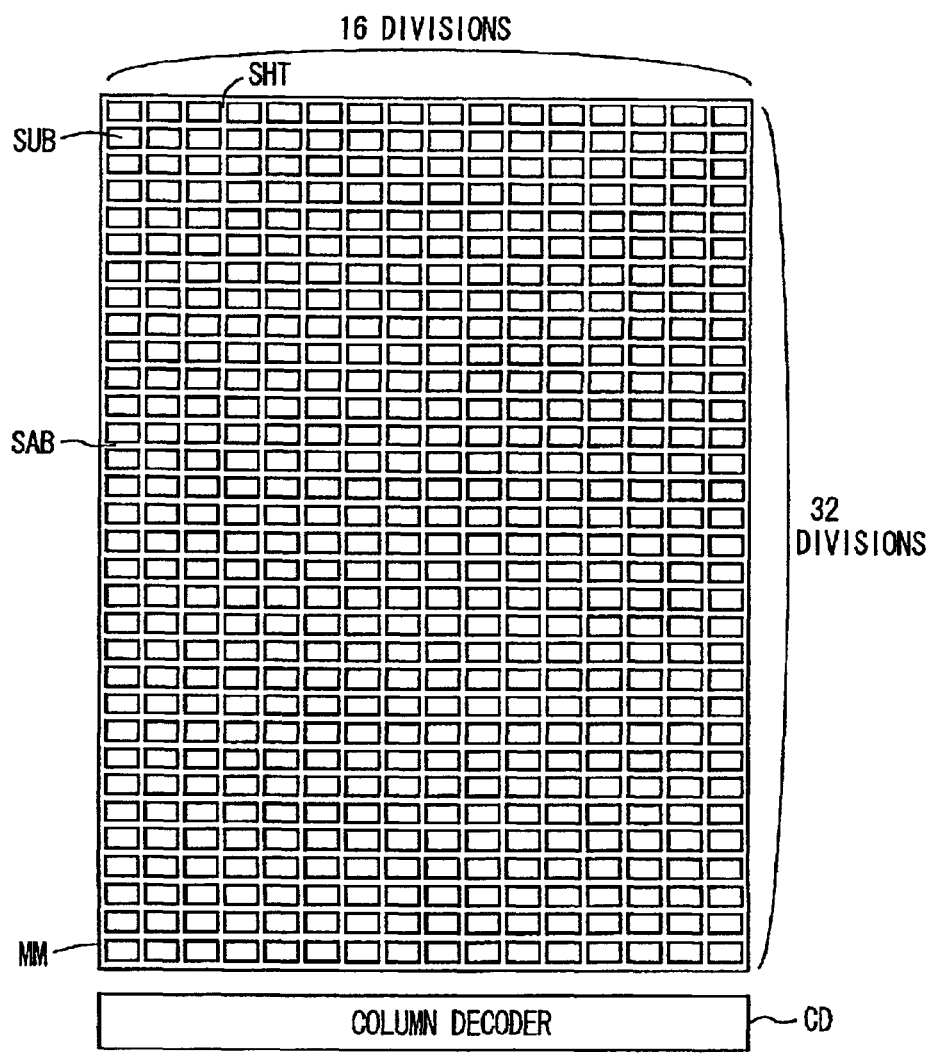
FIG. 17B is a diagram specifically showing a configuration of one of the memory mats shown in FIG. 17A.
Figure 18:
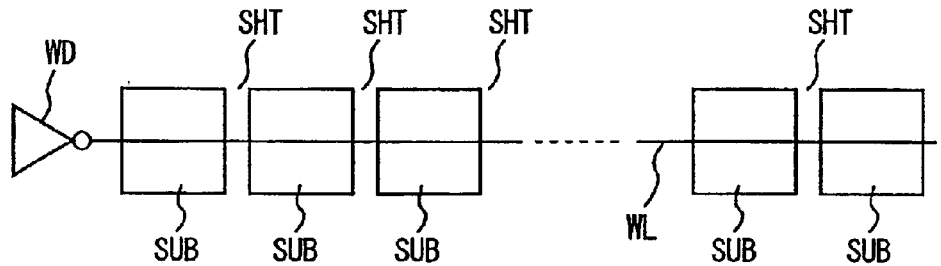
FIG. 18 is a diagram schematically showing an arrangement of a word line in the configuration of a memory mat shown in FIG. 17B.
Figure 19:
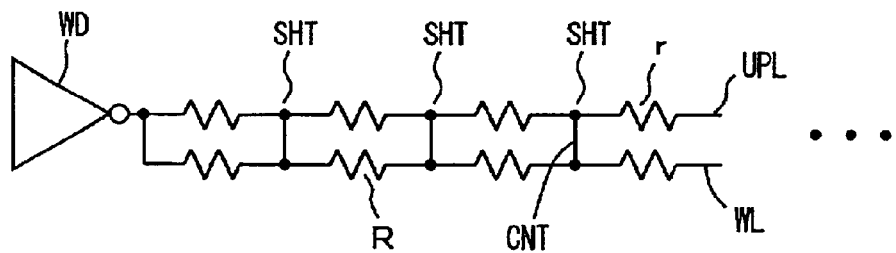
FIG. 19 is a diagram showing an electrically equivalent circuit of a word line arrangement shown in FIG. 18.
Figure 20:
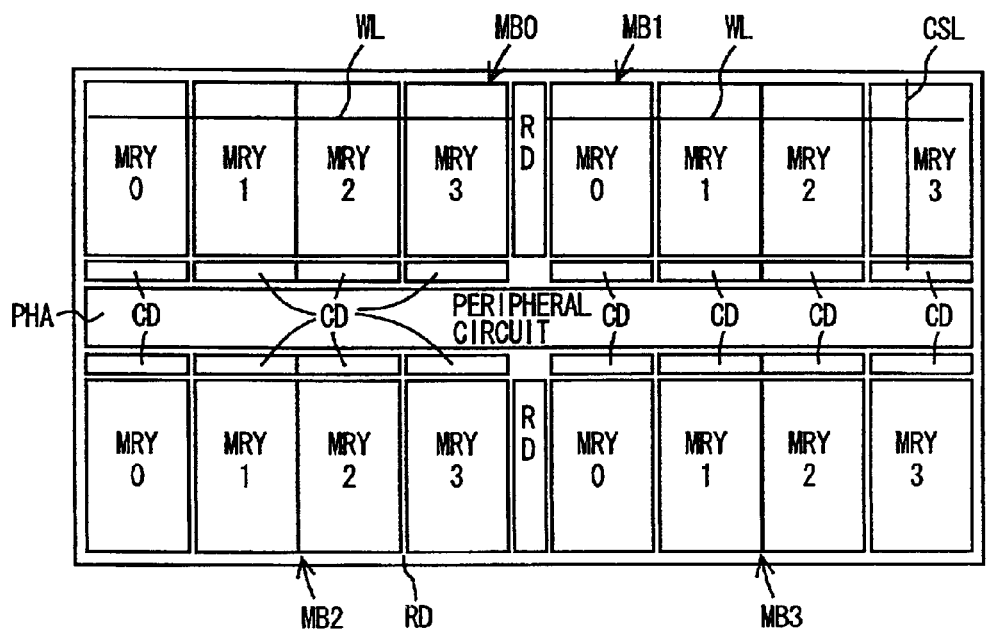
FIG. 20 is a diagram showing another arrangement of memory mats of a conventional semiconductor memory device schematically.
Figure 21:
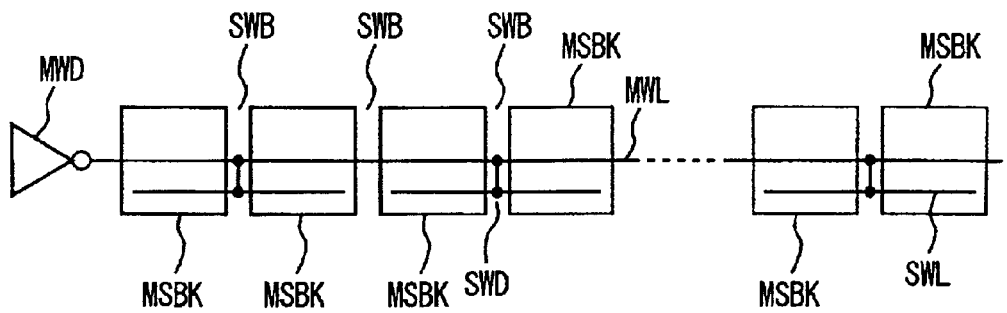
FIG. 21 is a diagram schematically showing a configuration related to a word line in the arrangement of memory mats shown in FIG. 20.
Figure 22:
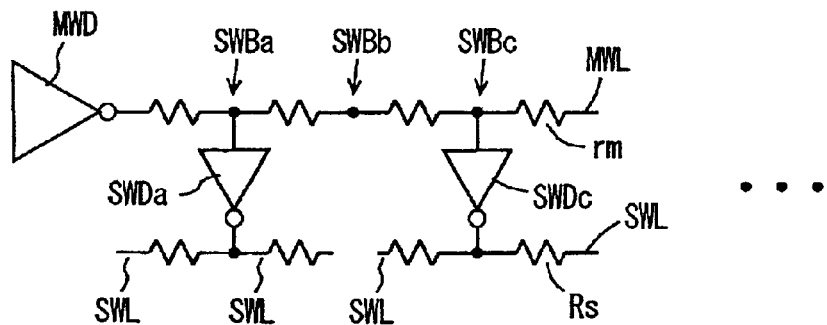
FIG. 22 is a diagram showing an electrically equivalent circuit of the configuration related to a word line shown in FIG. 21.
Figure 23:
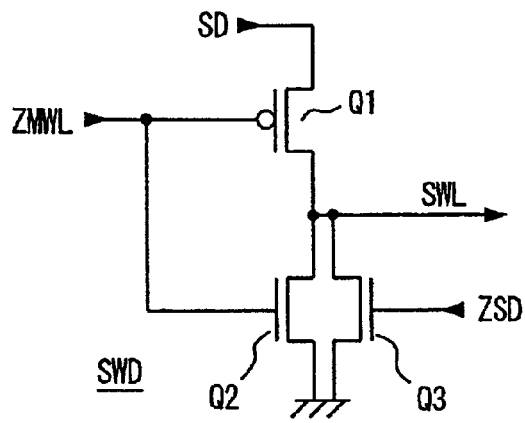
FIG. 23 is a diagram schematically showing a configuration of sub word driver shown in FIG. 22.
Figure 24:
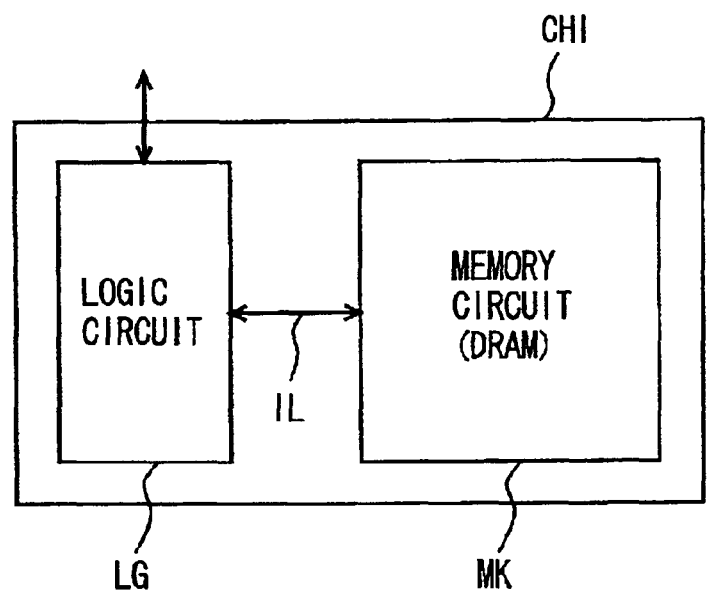
FIG. 24 is a diagram schematically showing a configuration of a conventional logic merged memory.

FIG. 16A is a diagram schematically showing a configuration of a memory sub array shown in FIG. 15. In FIG. 16, 3 memory sub arrays G0 to G2 are representatively shown. Main word line MWL transmitting a main word line drive signal from main word driver MWD is provided commonly to memory sub arrays G0 to G2. In memory sub array G0, sub word drivers SWDL and SWDR are disposed on rows alternately in respective sub word driver groups SWGL and SWDR. In memory sub array G1 as well, sub word drivers SWDL and SWDR are disposed on rows alternately in respective sub word driver groups SWGL and SWDR. In memory sub array G2 as well, sub word drivers SWDL and SWDR are disposed on rows alternately in respective sub word driver groups SWGL and SWDR.

In each of memory sub arrays G0 to G2, shunting interconnection lines are provided corresponding to respective sub word lines SWL. Shunt interconnection line LN is first level metal interconnection line and electrically connected to sub word line SWL in the lower layer by contact CNT in shunt region STH. Arrangement of shunting interconnection lines LN and sub word lines SWL are similar to that of the first embodiment, and a shunting interconnection line LN and a corresponding sub word line SWL are electrically conneced together at both opposed ends as well.

In memory sub arrays G0 to G2 of the configuration shown in FIG. 16, activation of sub word lines are performed with one memory sub array being a unit and therefore, when one row is selected, a sub word line is driven into a selected state in a memory sub array specified by a bank address (a memory sub array select signal) among memory sub arrays G0 to Gk coupled to a corresponding main word line MWL.

FIG. 16B is a diagram showing an example of a configuration of sub word driver SWDL and SWDR. Since Sub word drivers SWDL and SWDR are of the same configuration with each other, one sub word driver SWD is representatively shown in FIG. 16B.

In FIG. 16B, sub word driver SWD includes: a P channel MOS transistor TR1 transmitting main word line drive signal ZMWL on main word line MWL to a node ND according to a sense amplifier enable signal BA·SE activated for a selected bank; an N channel MOS transistor TR3, selectively rendered conductive in response to a signal potential on node ND, and holding sub word line SWL at ground potential when made conductive; a P channel MOS transistor TR2, selectively rendered conductive in response to a signal potential on node ND, for transmitting a sub decode signal BA·SD applied to a selected bank (memory sub array) to sub word line SWL when made conductive; an N channel MOS transistor TR4, selectively rendered conductive according to a bank sub decode signal BA·ZSD applied to a selected memory sub array (bank), for holding sub word line SWL at ground potential when made conductive; and an N channel MOS transistor, selectively rendered conductive in response to a signal on sub word line SWL, for holding node ND at ground potential when rendered conductive.

A bank select signal BA is generated by decoding a bank address and activated for a selected bank.

Main word line drive signal ZMWL is driven into an active state (L level) in a period between word line selection and sense amplifier activation, in the form of a one-shot pulse. In a selected bank, when bank sense amplifier activation signal BA·SE goes to H level, MOS transistor TR1 enters a non-conductive state, and takes in and latches main word line drive signal ZMWL transmitted to node ND. Sub decode signals SD and ZSD are applied only to a memory sub array specified by bank select signal BA (to change according to an address signal). The selected bank is held to be in a selected state till a precharge instruction signal is applied subsequently.

When a voltage level of node ND is at L level, a corresponding main word line is driven into a selected state and MOS transistor TR2 enters a conductive state, while MOS transistor TR3 enters a non-conductive state. At this time, if bank sub decode signal BA·SD is at H level, sub word line SWL is driven into a selected state and in response, MOS transistor TR5 becomes conductive to hold node ND at L level. In this state, in a selected memory sub array, a precharge instruction signal is then applied and bank sense amplifier activation signal BA·SE maintains a selected state at H level till bank sense amplifier activation signal BA·SE is driven into an inactive state at L level.

For selected sub array, bank sense amplifier activation signal BA·SE is held at H level. In a sensing operation, MOS transistor TR1 maintains its non-conductive state in selected sub array (bank). In selected bank (memory sub array), selected sub word line maintains its selected state (bank sub decode signal BA·SD is latched in a decoded state by a latch circuit) even when main word line drive signal ZMWL is restored to an inactive state.

On the other hand, when node ND is at L level and bank sub decode signal BA·SD is at L level, then MOS transistor TR2 enters a non-conductive state. At this time, bank sub decode signal BA·ZSD attains to H level, MOS transistor TR4 becomes conductive, sub word line SWL is held at a ground potential level and thereby, MOS transistor TR5 maintains its non-conductive state.

On the other hand, when a voltage level of node ND is at H level, MOS transistor TR3 enters a conductive state, sub word line SWL maintains its L level irrespective of a logic level of bank sub decode signal BA·SD and thereby, MOS transistor TR5 maintains its non-conductive state.

In a case where bank select signal BA is at L level and a bank (memory sub array) other than a corresponding memory sub array is specified, bank sub decode signal BA·SD is kept at L level, complementary bank sub decode signal BA·ZSD is kept at H level and sub word line SWL maintains its L level. At this time, bank sense amplifier activation signal BA·SE is at L level and MOS transistor TR1 enters a conductive state. Even when main word line drive signal ZMWL is an one-shot pulse signal and driven to L level to further drive node ND to L level, sub word line SWL maintains its non-selected state if main word line drive signal ZMWL is restored to H level before bank sub decode signal BA·SD is driven to H level.

Furthermore, such a configuration may be employed instead of the above configuration, that bank sense amplifier activation signal BA·SE is at L level in a prescribed period for a selected bank and main word line drive signal ZMWL is captured at node ND. Bank sub decode signal BA·SD can be made faster in generation timing.

Sub word line SWL is driven into a selected state only in a memory sub array specified by bank select signal BA. Bank select signal BA is generated by decoding a bank address and is transmitted through a sub word driver band. In a selected bank, since bank sense amplifier activation signal BA·SE is held at H level and is transmitted to sub word driver band. Since bank sense amplifier activation signal BA·SE is transmitted commonly to all of memory sub arrays Gi included in one bank, therefore, if one memory sub array is selected in the one bank, a different sub array cannot be selected in the same bank.

Row decoder circuits each generating a main word line drive signal are provided corresponding to the respective row blocks and generate a one-shot pulse signal as a main word line drive signal. A sub decode signal is transmitted through a sub word driver band and held at a latch state according to bank select signal BA with each one bank being a unit. Therefore, a circuit for performing control of row selection according to bank select signal BA is provided corresponding to each respective bank.

Alternatively, a further configuration may be employed: a row address decode operation is performed to generate a main word drive signal together with a sub decode signal with each row block being a unit; when a corresponding bank select signal is in an active state, a corresponding sub decode signal is held in a latched state for each memory sub array. A latch circuitry for maintaining the sense amplifier activation signal BA·SE in an active state according to bank select signal BA, and for latching bank sub decode signal BA·SD have only to be provided at each of regions where sense amplifier bands and sub word driver bands intersect with each other. By use of latch circuitry similar in configuration to the sub word driver, memory sub arrays can be activated/deactivated on a bank basis.

In such a configuration that a sub word line is driven into a selected state with memory sub arrays included in plural row blocks being a unite, by applying a hierarchical word line structure and a word line shunt structure both, a sub word line can be driven into a selected state at high speed, and furthermore, a multi-bank memory capable of performing a high speed access can be implemented.

[Other Embodiments]

In the above description, there are shown an embedded memory integrated with a logic on the same semiconductor chip. However, in a standard DRAM, too, if it is a semiconductor memory device having a triple level metal interconnection structure or a quadruple level metal interconnection structure, the present invention can be applied in a similar manner.

Furthermore, the hierarchical word line structure and the word line shunt structure can also be applied to SRAM (static random access memory), not limited to DRAM.

As described above, according to the present invention, a hierarchical structure composed of main word lines and sub word lines are employed for word line configuration/arrangement and further, sub word lines each are of a shunt structure, thereby enabling a sub word line to be driven into a selected state at high speed without a great increase in occupancy area of a memory array.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:
   a plurality of memory cells arranged in rows and columns;
   a plurality of sub word lines, provided corresponding to the respective memory cell rows, each having memory cells on a corresponding row connected thereto;
   a plurality of main word lines, each provided corresponding to a prescribed number of sub word lines in said plurality of sub word lines and disposed in a first conductive layer, for transmitting a row select signal;
   a plurality of shunting interconnection lines, provided corresponding to the respective sub word lines in a second conductive layer formed under said first conductive layer, each shunting interconnection line for electrically connecting to a corresponding sub word line at a prescribed interval and allowing signal transmission between said each shunting interconnection line and said corresponding sub word line; and a plurality of sub word drivers, provided corresponding to the sub word lines, each for driving a corresponding sub word line and a corresponding shunting interconnection line into a selected state according to at least a row select signal on a corresponding main word line.

2. The semiconductor memory device according to claim 1, wherein said first conductive layer is a third level metal interconnection layer and said second conductive layer is a first level metal interconnection layer.

3. The semiconductor memory device according to claim 1, wherein each of said plurality of sub word lines is electrically connected to a corresponding shunting interconnection line at both opposed ends thereof.

4. The semiconductor memory device according to claim 1, further comprising an intermediate voltage transmission line, formed in a third conductive layer different from the first and second conductive layers, for transmitting an intermediate voltage at a prescribed voltage level.

5. The semiconductor memory device according to claim 4, wherein said third conductive layer is a second level metal interconnection line formed in an interconnection layer between the first and second conductive layers.

6. The semiconductor memory device according to claim 4, wherein each memory cell has a capacitance for storing information and said intermediate voltage is applied to a reference power supply node of said capacitance.

7. The semiconductor memory device according to claim 6, wherein said reference power supply node is formed under said second conductive layer said third conductive layer is electrically connected to said reference power supply node through a metal interconnection line formed in said second conductive layer.

8. The semiconductor memory device according to claim 1, wherein said plurality of sub word lines are grouped into a plurality of groups along a row direction and said plurality of sub word drivers performs a select operation in units of the groups.

9. The semiconductor memory device according to claim 1, further comprising a power supply line, disposed in an interconnection layer different from said first conductive layer over a memory cell array in which said plurality of memory cells are arranged, for transmitting a power supply voltage.

10. The semiconductor memory device according to claim 1, wherein said semiconductor memory device is an embedded memory integrated with a logic circuit a common semiconductor substrate.

11. The semiconductor memory device according to claim 1, wherein the shunting interconnection line is a copper interconnection line.

12. The semiconductor memory device according to claim 1, wherein said plurality of shunting interconnecting lines are each electrically connected to the corresponding sub word line through contacts formed at said prescribed interval.

* * * * *